(12) United States Patent
Murray et al.

(10) Patent No.: US 11,810,606 B2
(45) Date of Patent: Nov. 7, 2023

(54) APPARATUS COMPRISING ONE OR MORE PHOTONIC MEMORIES

(71) Applicant: ORCA Computing Limited, London (GB)

(72) Inventors: Richard Murray, London (GB); Joshua Nunn, Bath (GB); Robert Francis-Jones, London (GB); Tom Parker, London (GB); Krzysztof Kaczmarek, London (GB)

(73) Assignee: ORCA Computing Limited, London (GB)

( * ) Notice: Subject to any disclaimer, the term of this patent is extended or adjusted under 35 U.S.C. 154(b) by 0 days.

(21) Appl. No.: 18/025,624

(22) PCT Filed: Sep. 21, 2021

(86) PCT No.: PCT/GB2021/052447
§ 371 (c)(1),
(2) Date: Mar. 9, 2023

(87) PCT Pub. No.: WO2022/058757
PCT Pub. Date: Mar. 24, 2022

(65) Prior Publication Data
US 2023/0245702 A1    Aug. 3, 2023

(30) Foreign Application Priority Data

Sep. 21, 2020   (GB) .................................. 2014884

(51) Int. Cl.
*G11C 13/04*    (2006.01)
*G06N 10/20*    (2022.01)
(Continued)

(52) U.S. Cl.
CPC ........... G11C 13/048 (2013.01); G06N 10/20 (2022.01); G06N 10/40 (2022.01); *G02B 5/26* (2013.01); *G02F 1/0136* (2013.01); *G02F 1/21* (2013.01)

(58) Field of Classification Search
CPC ...... G11C 13/048; G06N 10/20; G06N 10/40; G02B 5/26; G02F 1/0136; G02F 1/21
See application file for complete search history.

(56) References Cited

U.S. PATENT DOCUMENTS

2004/0109633 A1    6/2004   Pittman et al.
2013/0279235 A1*  10/2013   Le Gouet ............... G11C 13/04
                                                          365/106
(Continued)

FOREIGN PATENT DOCUMENTS

CN         210865631 U      6/2020
WO      WO 2011/073656 A1   6/2011
(Continued)

OTHER PUBLICATIONS

PCT International Search Report and Written Opinion, PCT Application No. PCT/GB2021/052447, dated Dec. 22, 2021, 13 pages.
(Continued)

*Primary Examiner* — Ajay Ojha
(74) *Attorney, Agent, or Firm* — Fenwick & West LLP

(57) ABSTRACT

An apparatus has a plurality of photonic elements. At least two photonic elements forming a cavity. At least one photonic element receives first electromagnetic radiation from outside the cavity and transmits the first electromagnetic radiation into the photonic cavity. At least one photonic element receives second electromagnetic radiation from outside the cavity and transmits the second radiation into the photonic cavity. A photonic memory disposed in the cavity comprises an atomic system that: receives a photon field of first radiation; receives second radiation; stores at least a
(Continued)

portion of the field of the photon in the atomic system via an atomic transition using the photon and the received second radiation; emits the stored portion of the photon upon receiving third electromagnetic radiation. The apparatus directs the photon into the photonic memory, after being reflected into the photonic cavity by at least one of the photonic elements; and outputs the emitted portion of the field into the cavity. The apparatus controls the photon flux density of the third electromagnetic radiation to control the superposition of the said stored field portion.

20 Claims, 17 Drawing Sheets

(51) Int. Cl.
*G06N 10/40* (2022.01)
*G02B 5/26* (2006.01)
*G02F 1/21* (2006.01)
*G02F 1/01* (2006.01)

(56) References Cited

U.S. PATENT DOCUMENTS

2018/0013016 A1 1/2018 Englund
2019/0164607 A1 5/2019 Kaczmarek et al.
2020/0066931 A1* 2/2020 Hankla .................. H02S 40/22

FOREIGN PATENT DOCUMENTS

WO WO 2017/212212 A1 12/2017
WO WO 2017212212 A 12/2017

OTHER PUBLICATIONS

GB Combined Examination and Search Report, GB Application No. GB2014884.7, dated Feb. 26, 2021, 8 pages.
GB Examination Report, GB Application No. GB2014884.7, dated Sep. 27, 2022, 3 pages.
GB Intention to Grant Under Section 18(4), GB Application No. GB2014884.7, dated Dec. 23, 2022, 2 pages.
Campbell, G.T. et al. "Configurable Unitary Transformations and Linear Logic Gates Using Quantum Memories," *Physical Review Letters*, vol. 113, No. 6, Aug. 4, 2014, pp. 1-5.
Knill, E. et al. "A Scheme for Efficient Quantum Computation with Linear Optics," *Nature*, vol. 409, Jan. 4, 2001, pp. 46-52.
Motes, K.R. et al. « Scalable Boson Sampling with Time-Bin Encoding Using a Loop-Based Architecture, *Physical Review Letters*, vol. 113, No. 12, Sep. 18, 2014, pp. 1-7.

* cited by examiner

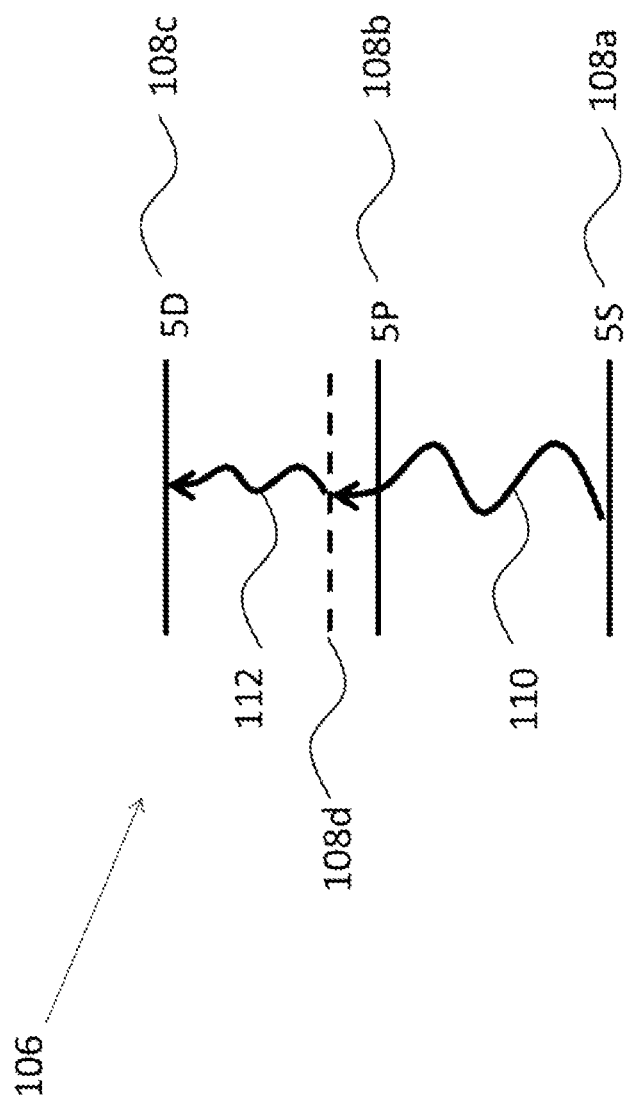

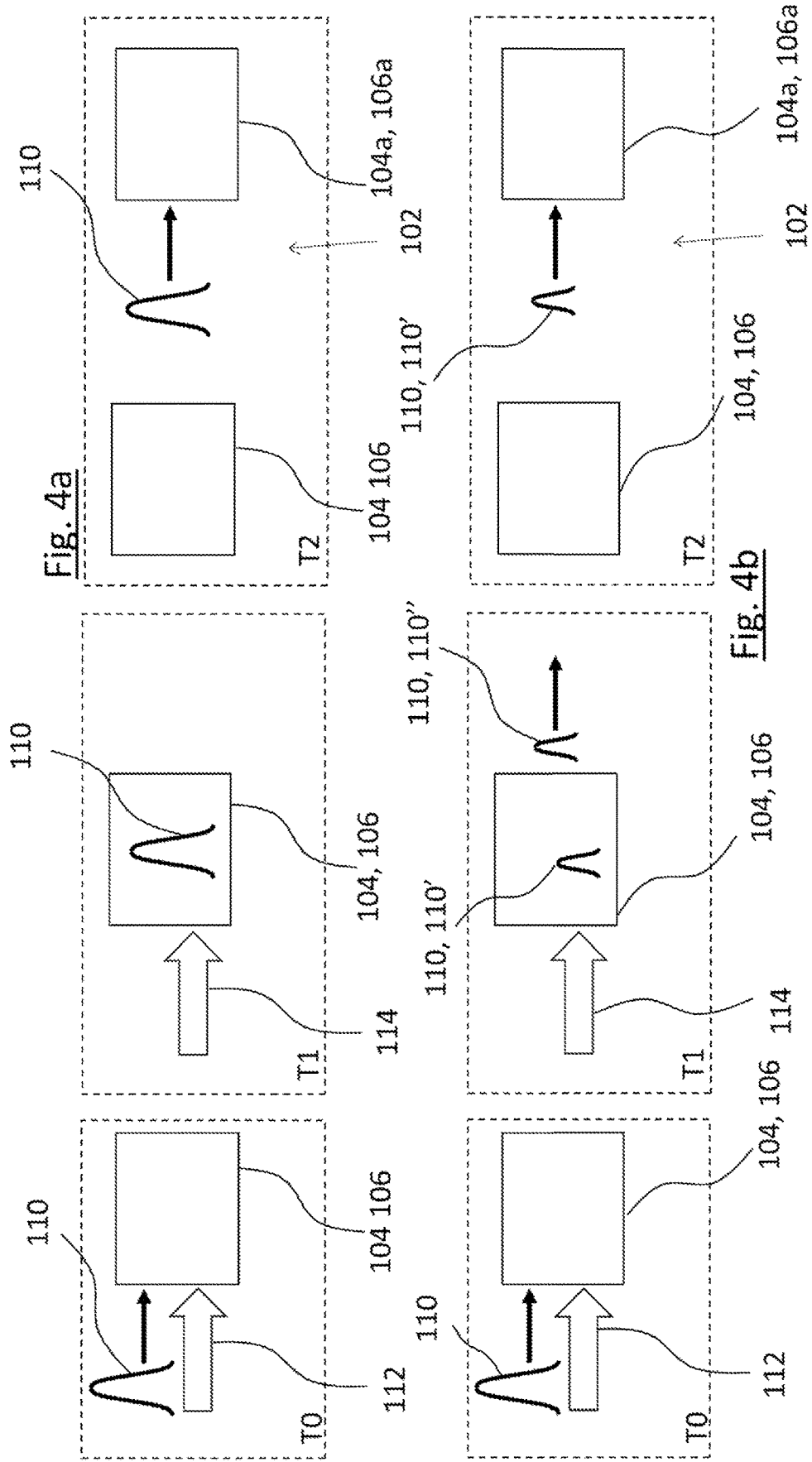

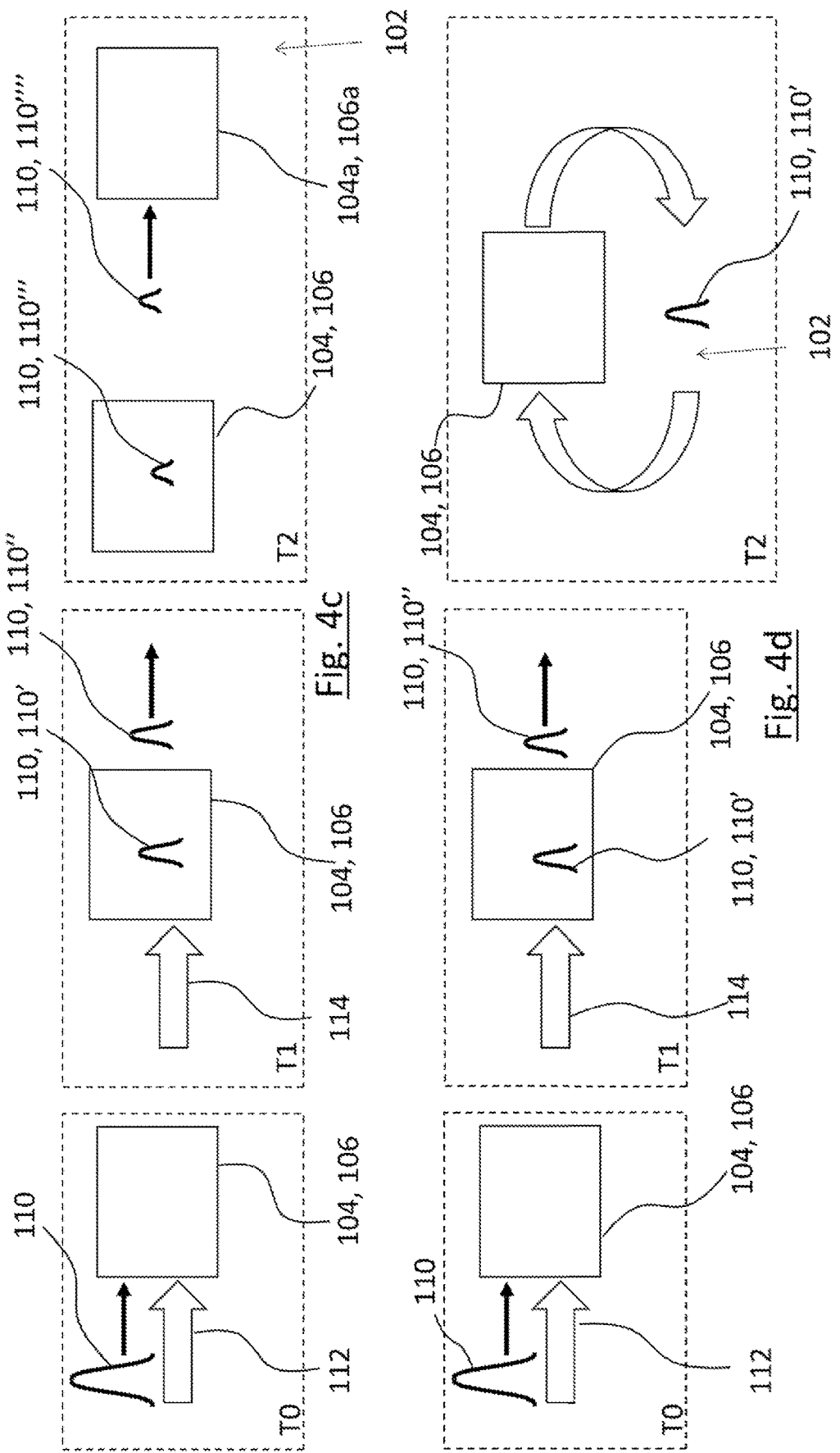

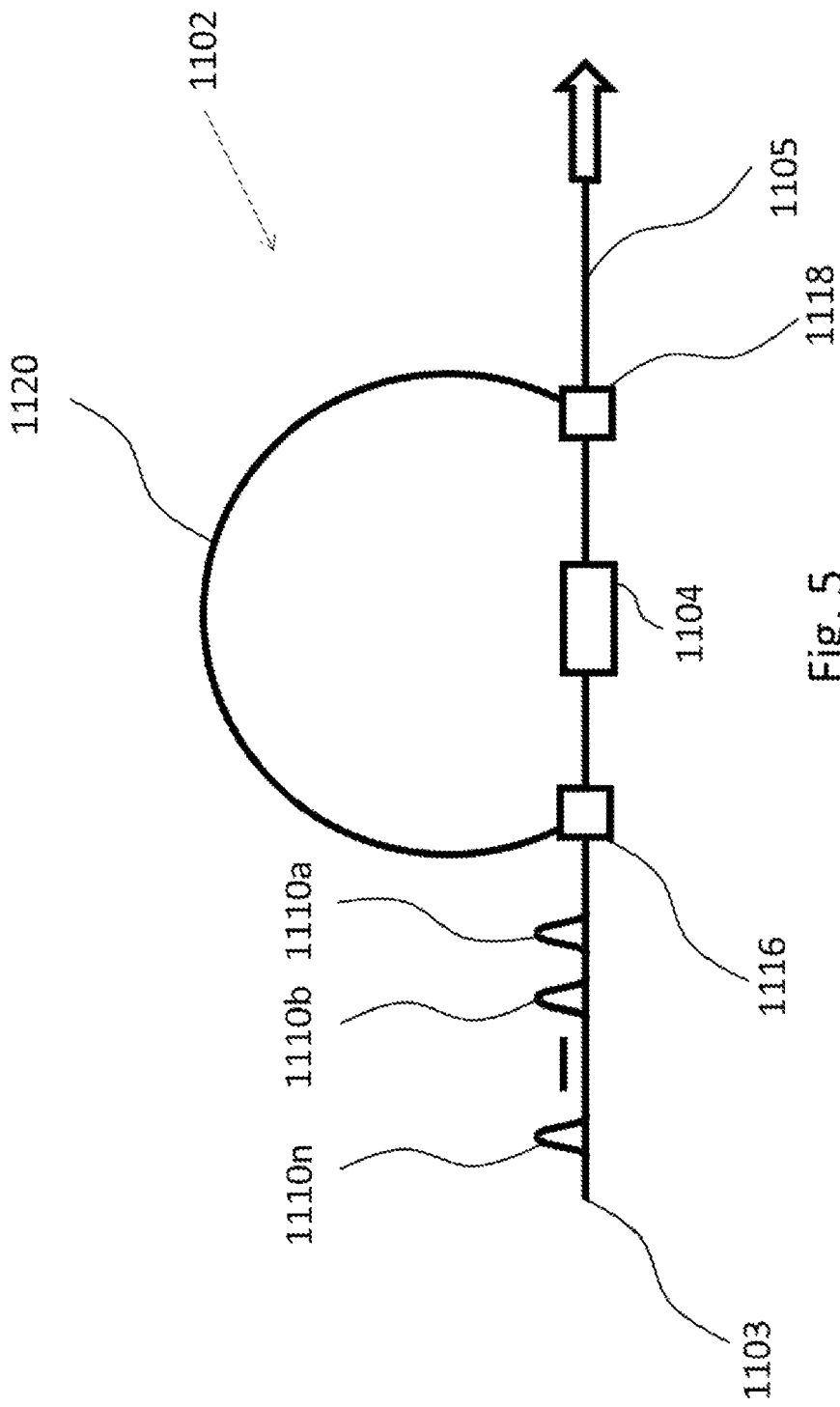

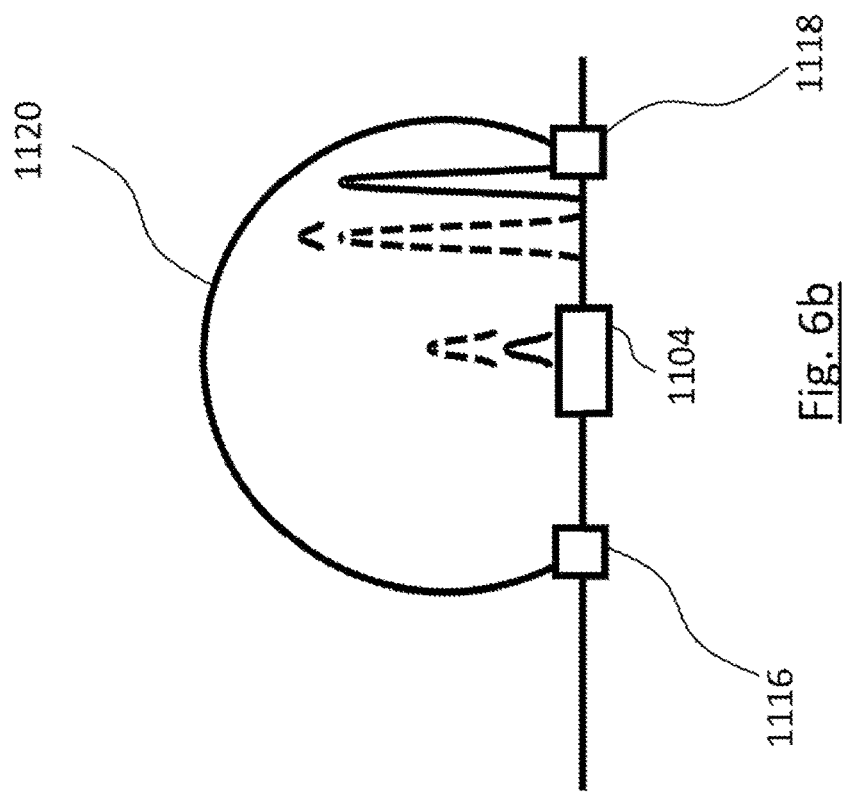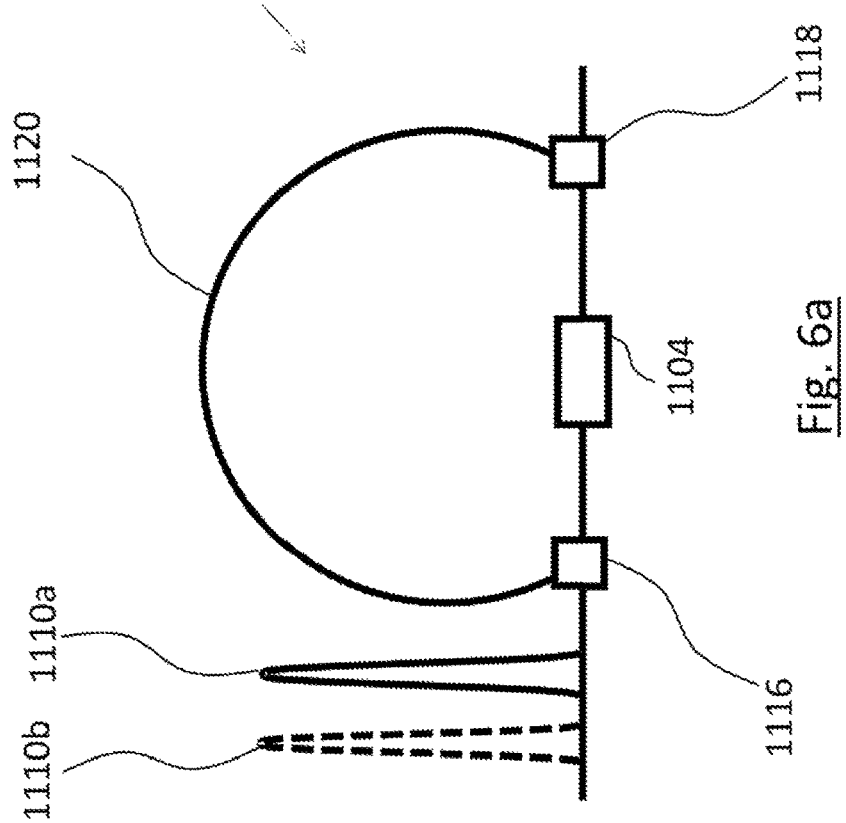

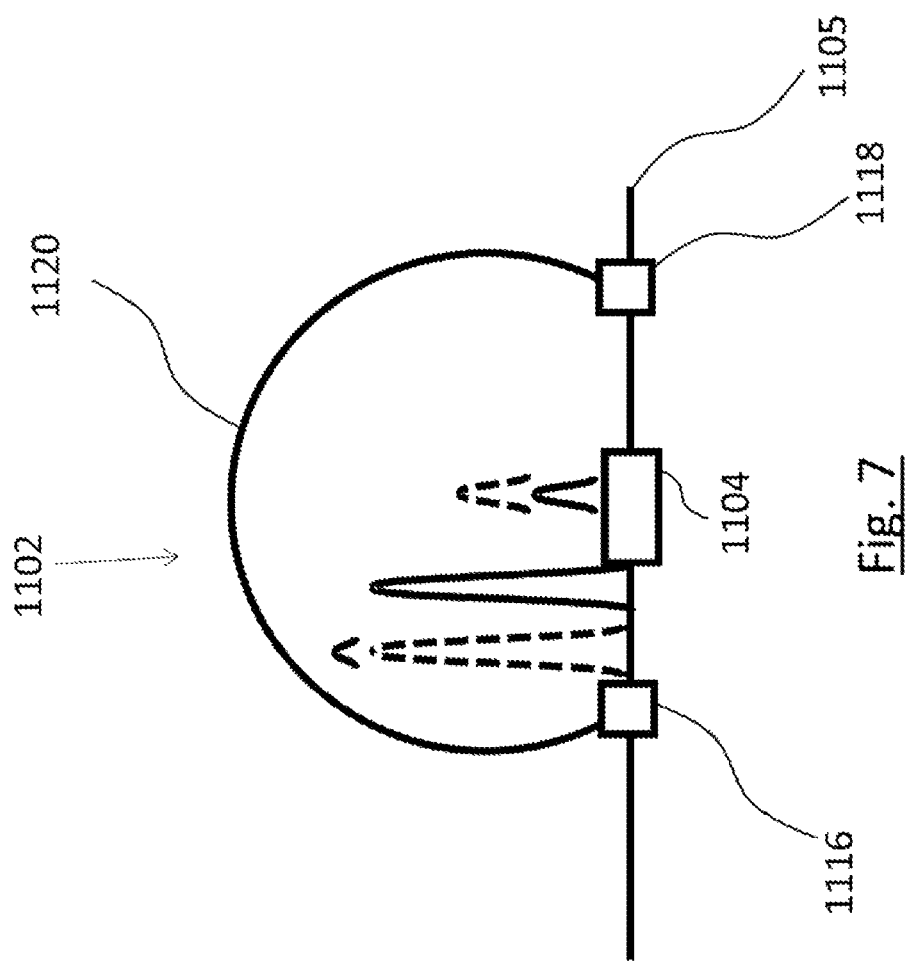

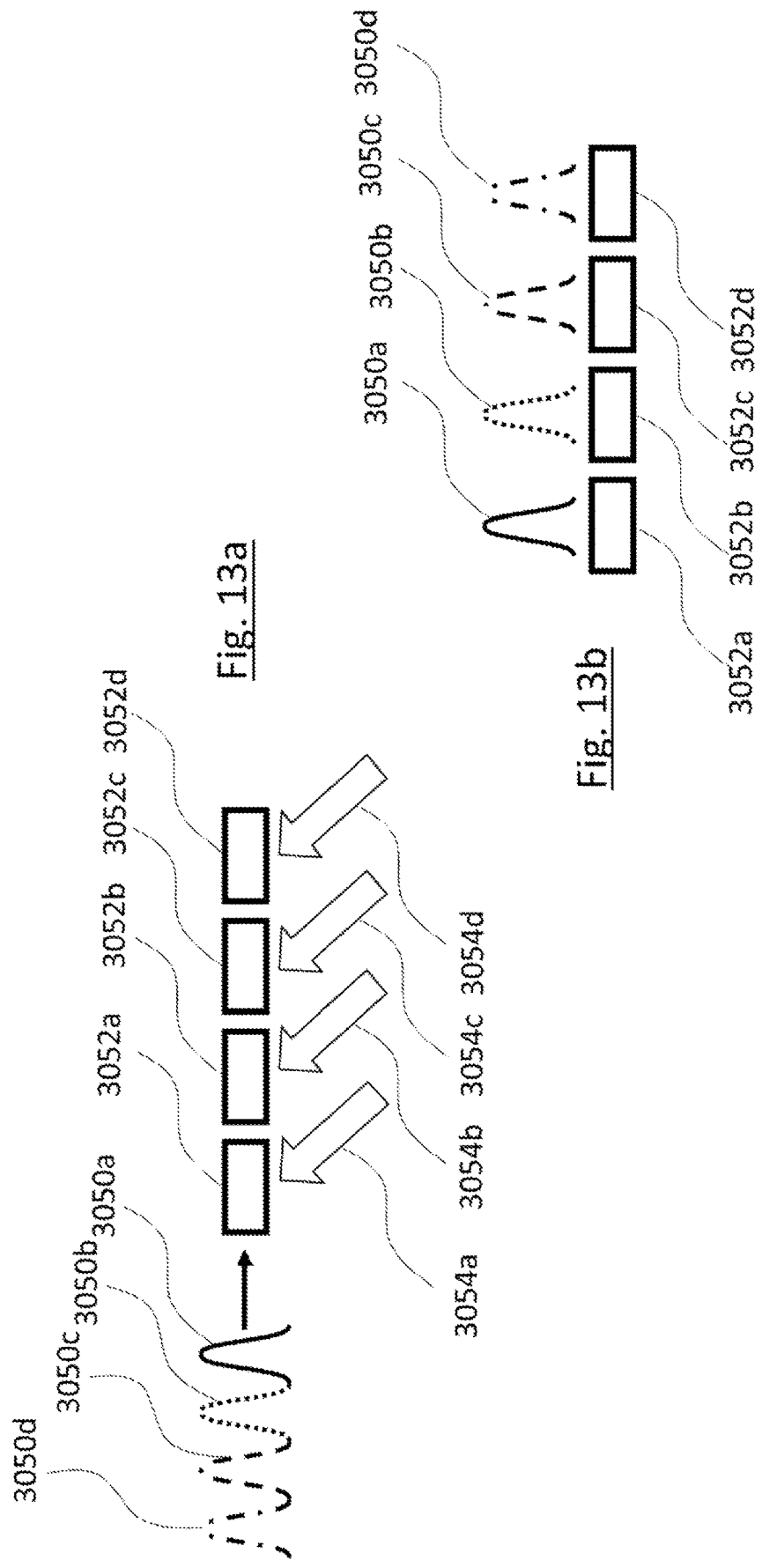

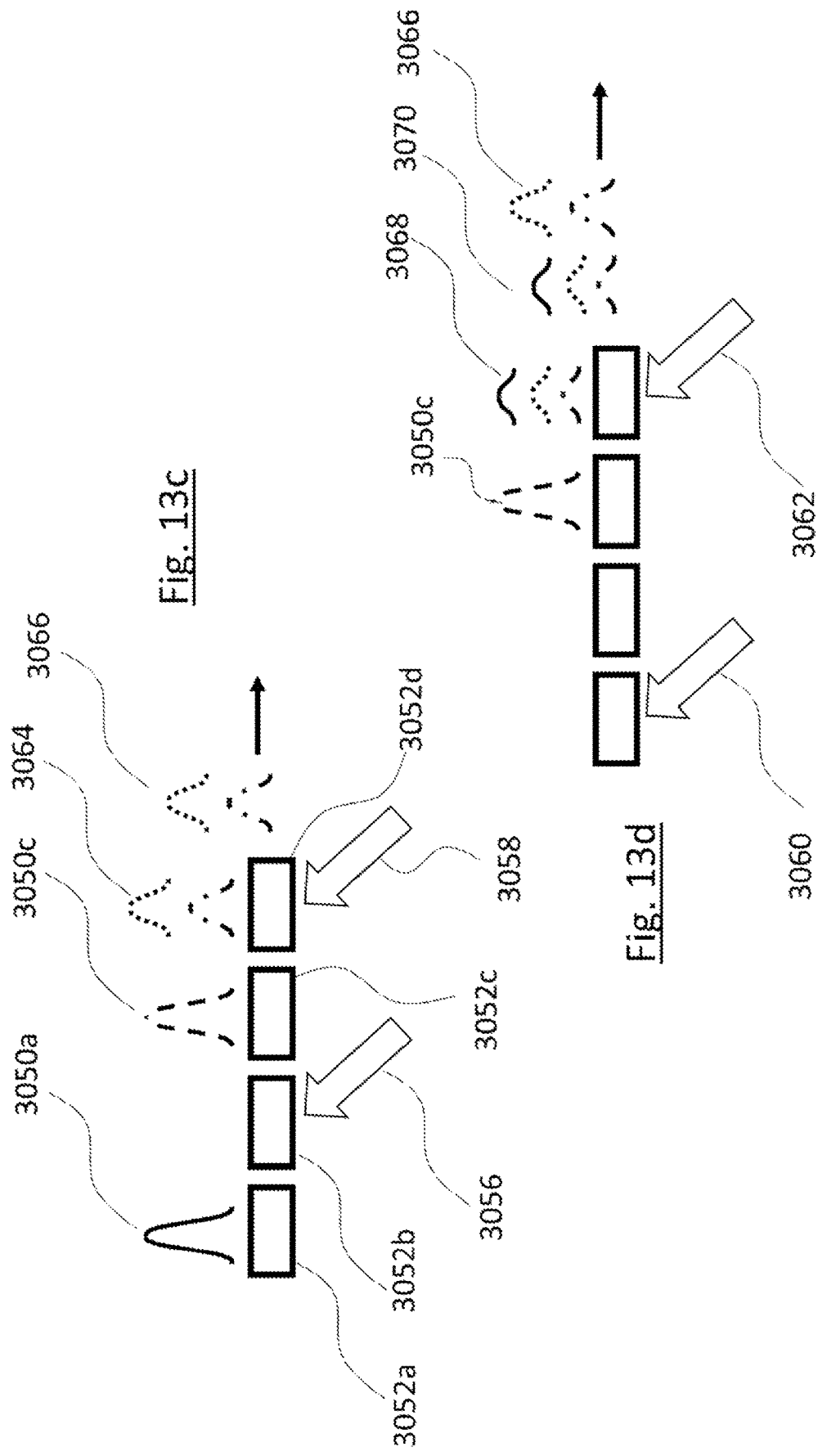

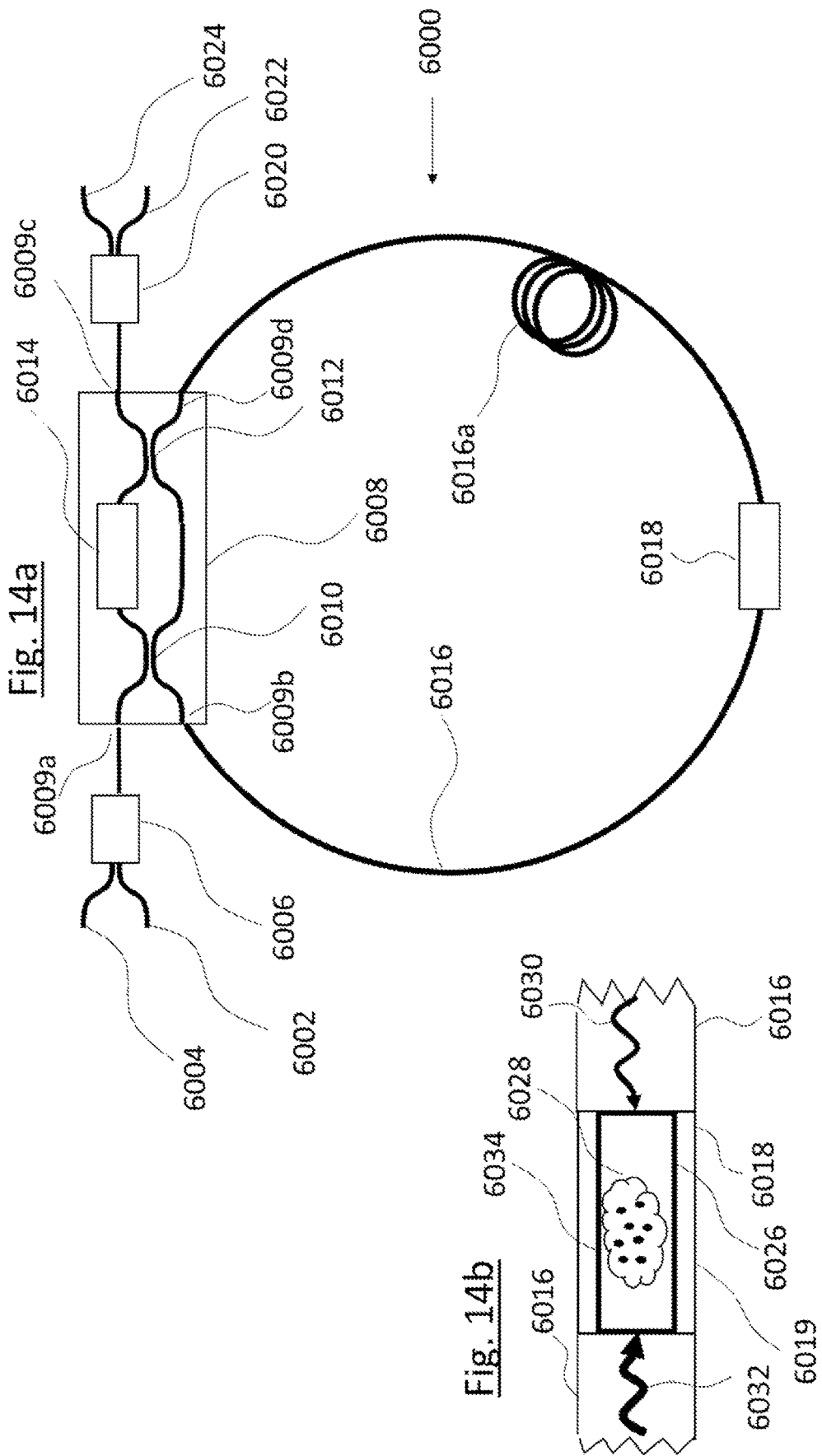

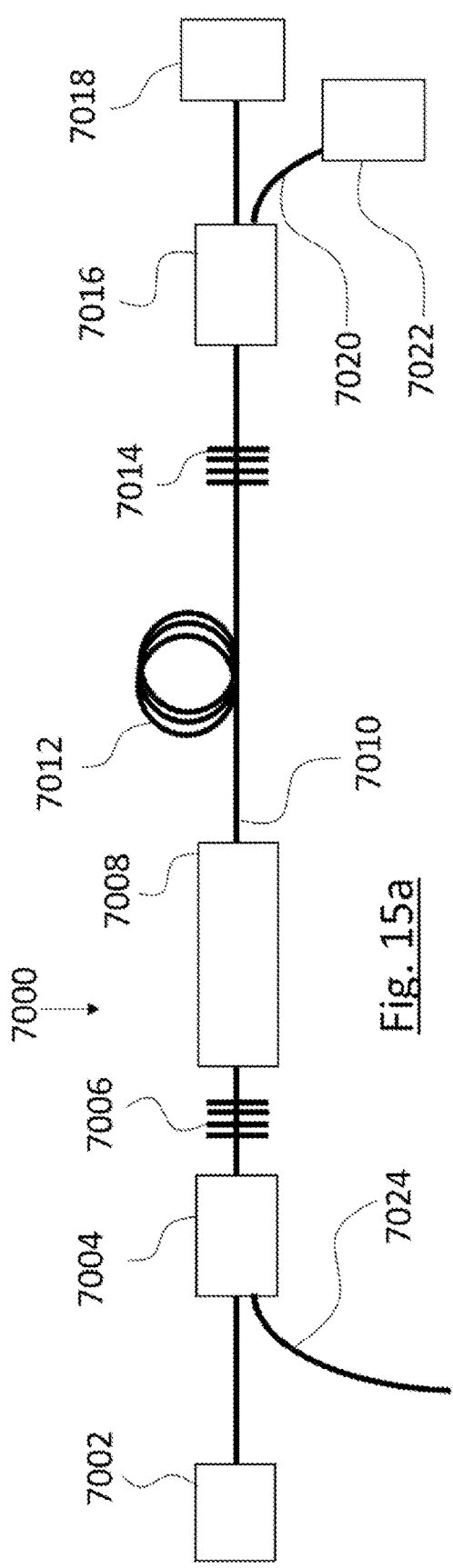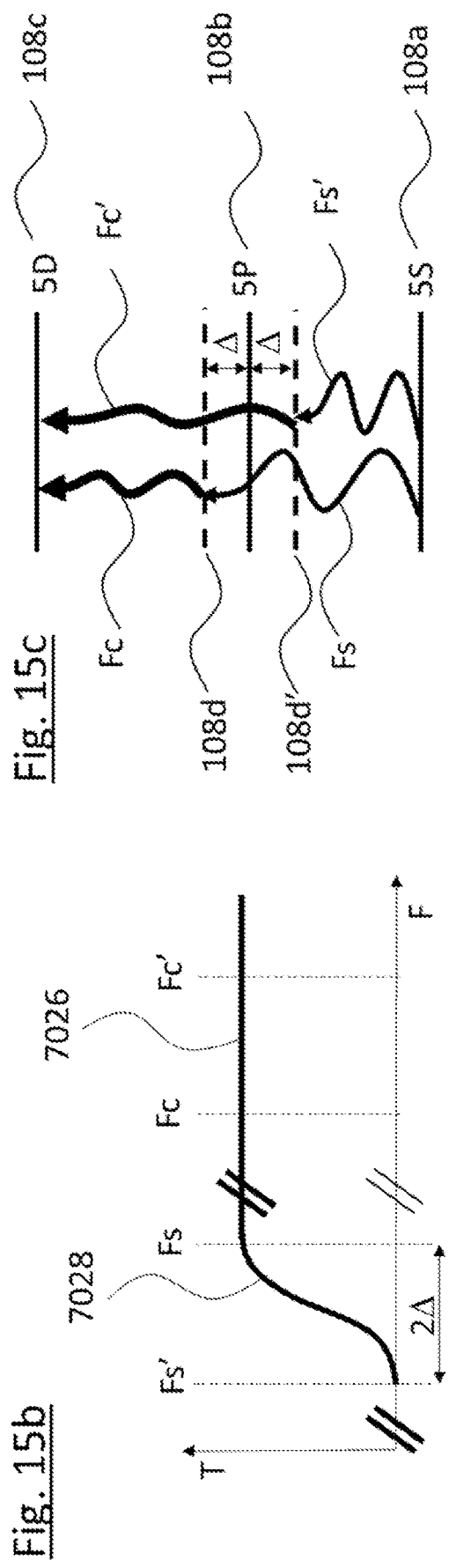

APPARATUS COMPRISING ONE OR MORE PHOTONIC MEMORIES

The present invention is in the field of apparatus comprising one or more photonic memories, in particular, but not limited to apparatus having a photonic memory based on resonant transitions that can emit photons that are stored in further photonic memories.

Quantum computing has been discussed as being a future of computing in particular for areas such as simulating quantum systems and factoring large numbers. The main goals of quantum computing are usually described to be 'quantum advantage' and 'quantum supremacy'. Quantum advantage is where the speed of the computation is faster for the quantum computing system than the classical computing system whilst quantum supremacy is the goal of showing the quantum computing system can solve a problem that is not solvable on a classical computer in a useful time frame.

There are several core principles that differentiate a classical computing system from a quantum computing system. The main one is that whilst classical computers utilise classical binary bits '0' and '1', quantum computing systems utilise states represented by a superposition of a plurality of orthogonal (and normalised) states. These orthogonal states are often called basis states. When limited to a two-level quantum system this state is called a qubit. Such quantum superpositions have no analogue in classical bits. The general pure qubit state |xv> can be represented by Equation 1.

$$|\psi\rangle = \alpha|0\rangle + \beta|1\rangle \quad \text{[Equ. 1]}$$

Where $\alpha$ and $\beta$ are complex coefficients that are normalised such that $\alpha^2+\beta^2=1$ and |0> and |1> are the basis vectors (basis states) of the qubit. The classical 0 and 1 of conventional computers are special examples of qubits where $\alpha=1$ and $\beta=0$ for the measured state '0' and where $\alpha=0$ and $\beta=1$ for the measured state '1'. Other qubits whose values of $\alpha$ and $\beta$ are greater than 0 and less than 1 give rise to quantum superposition whereby there is a finite chance to yield either state upon measurement.

The coefficients $\alpha$ and $\beta$ of the qubit are complex numbers and are more generally represented on the Bloch sphere shown in FIG. 1 and by equations 2 and 3 where $e^{(i\phi)}$ represents relative phase and global phase is represented by $e^{(i\psi)}$. For a pure qubit state |ψ>, $\theta$ and $\phi$ are the angles on the Bloch sphere representation wherein $0 \leq \theta \leq \pi$ and $0 \leq \phi \leq 2\pi$. The points on the surface of the Bloch sphere are pure states of the quantum system whilst interior points are mixed states.

$$\alpha = e^{i\psi}\cos\frac{\theta}{2}$$

$$\beta = e^{i(\psi+\phi)}\sin\frac{\theta}{2} \quad \text{[Equ. 2, 3]}$$

A parametrised form of Equation 1 is shown in Equation 4. Because the physics of quantum systems representing single qubits only considers relative phase, the coefficient of |0> is real and non-negative so a qubit is generally represented as shown in equation 4.

$$|\psi\rangle = \cos\frac{\theta}{2}|0\rangle + e^{i(\phi)}\sin\frac{\theta}{2}|1\rangle \quad \text{[Equ. 4]}$$

Therefore, as described above, for example a qubit state with a 100% probability of measuring the state of 1 has $\theta=\pi$, hence a coefficient $\beta$ of 1 and a coefficient $\alpha$ of 0. Such a qubit state is equivalent to a classical computing state of 1. However, a qubit state with a 50% chance of being in either basis state 0 or 1, when measured, has pre-measurement qubit coefficients defined by Equation 5.

$$\alpha = \beta = \frac{1}{\sqrt{2}} (\text{i.e. } \alpha^2 = \beta^2 = 1/2) \quad \text{[Equ. 5]}$$

A state stays in this superposition until either a measurement is made on the qubit, which collapses the qubit into the classical regime, or an operation is applied to the qubit to change its projection on the Bloch sphere. Until the qubit is measured it exists in all states permitted by the qubit superposition. Indeed, qubits that represent different states in the quantum realm may yield the same physical value when measured. However, when in a superposition state (pre-measurement) the different phases of the qubits may be utilised in the quantum circuit to effect different operations.

Several approaches for realising quantum computation are being investigated in the field, both in terms of the computing technique and the technologies required to implement them.

There are a number of different hardware platforms currently being developed to implement quantum computers. Technologies being utilised include atom and ion traps, superconducting qubits, atomic-scale solid-state defects and photonics. In classical computers, a bit is physically represented by the voltage across a semiconductor transistor.

In quantum computers, qubits are implemented using two level quantum states, which are specific to the exact implementation and physical system being used. Examples of quantum states for fermions are the spin up and spin down of an electron. An example of a boson is a photon, a single quantum of light. A quantum photonic system may be 'encoded' in different ways to represent the 0 and 1 basis states of the qubit. Typical photonic qubit encoding includes polarization of a single photon, for example basis states of a single photon may be defined as: vertical polarization and horizontal polarization; or right-handed circular and left-handed circular polarization. Other encoding includes: path or spatial encoding where a single photon may be input into a beam splitter with a finite probability of being output in either of two different output paths; time bin encoding wherein a single photon may be in one of two temporally separated time bins.

In addition to several competing hardware platforms, there are also a number of different paradigms for performing the quantum computation itself. These include using quantum gates (in the 'gate model') and cluster (or graph) states (in the measurement-based computing model), as well as others. The gate model applied using photonics is often termed Linear optical quantum computing (LOQC). One approach to LOQC is described by Knill, Laflamme & Milburn in 'A scheme for efficient quantum computation with linear optics', Nature, 409:46-52, 2001. Similar to classical computing, gates act as operators on qubits. Some of the most commonly used gates include the Controlled-NOT (CNOT) gate and the Hadamard (H) gate. The CNOT operator operates in an analogous manner to the XOR gate in classical computing. The Hadamard gate applies a rotation to the superposition state on the Bloch sphere and is an important gate because it can transform a deterministic classical state to an equal superposition state. For example, a 50/50 beam splitter acts in a similar way to a Hadamard gate because it can take a known determined state of a single photon and output a linear superposition of states representing the photon either being in the first output path or the second output path.

A sequence of quantum gates, such as the Hadamard and CNOT gates that act upon qubits is termed a quantum circuit. For quantum computing to work, these gates must be reversible. The gates of a quantum circuit are forms of unitary operators 'U', often referred to as unitaries. Unitaries and indeed qubits are often represented and manipulated in matrix form. A unitary is a unitary matrix, i.e. U multiplied by its conjugate transpose U* is equal to the identity matrix.

The photonic circuits that implement the unitaries of a quantum circuit can be simply made up of a sequence of beam splitters and phase shifters. However, given this seemingly simple implementation, LOQC can be difficult to implement in practice due to pulse synchronisation, the need for fast tuneable phase shifters, fast tuneable delay lines, fast tuneable beam splitters and fast single photon detectors. LOQC therefore normally requires active elements. Attempts to achieve a single teleported CNOT gate have been reported to require $>10^4$ optical elements.

Boson sampling has been previously reported as a method for demonstrating quantum advantage in quantum photonic systems without a full implementation of LOQC. FIG. 2 shows a schematic example of the boson sampling principle. Boson sampling takes an input state of 'n' photons in 'm' modes, typically from a number of single photon sources 4, passes this state through a Unitary 6 and looks at the distribution of photons in the output modes by coincidence detection using a number of optical detectors 8.

Several previous articles discussing boson sampling use spatial modes. In this scheme the single input state of multiple modes is input into a photonic circuit that acts as the unitary U transform to the single input state. The number of input modes is greater than the number of photons, such that the states of several the modes are vacuum states. The 'n' photons are simultaneously input into the unitary photonic circuit by a plurality of single photon sources. Typically, the number of modes quadratically increases with the number of photons. The photonic circuit has a series of inputs and a series of outputs that are each individually monitored by an optical detector.

This measurement is repeated a plurality of times to build up a statistically representative map of the Unitary. For n photons there will generally be (n+m−1 "choose" n) ways for the photons to reach the outputs.

Unlike LOQC, boson sampling has been reported to focus on using passive elements and, importantly in some configurations can use 'bucket' optical detectors (discussed below) rather than single photon detectors. As discussed above, most previous versions of boson sampling use spatial modes, a linear interferometer, and a plurality of optical detectors. A theoretical scheme for implementing boson sampling in the time domain, using multiple fibre loops and a variable reflectivity beam splitter has been described in "Scalable boson-sampling with time-bin encoding using a loop-based architecture" by Keith R. Motes et al., Phys. Rev. Lett. 113, 120501, 2014 wherein the variable beam splitter controls the pulses entering the inner fibre loop. In this paper the beam-splitter technology is not provided and despite requiring fewer components than the spatial boson sampling examples, multiple fibre loops are still required, thus still limiting the compactness of a device made according to this theoretical design. Furthermore, Motes described the dominant source of error in the boson sampling to be temporal mode-mismatch caused by errors in the lengths of the fibre loops. Having multiple fibre loops increases the likelihood of such errors.

SUMMARY

In a first aspect there is presented an apparatus for storing one or more photons, the apparatus comprises: I) one or more photonic elements comprising: at least one photonic element forming part of a photonic cavity; at least one photonic element for receiving first electromagnetic radiation from outside the photonic cavity and transmitting the said received first electromagnetic radiation into the photonic cavity; at least one photonic element for receiving second electromagnetic radiation from outside the photonic cavity and transmitting the said received second electromagnetic radiation into the photonic cavity; II) a photonic memory disposed in the photonic cavity, the photonic memory comprising an atomic system configured to: receive at least one photon of first electromagnetic radiation, the photon having a field; receive second electromagnetic radiation; store at least a portion of the field of the photon in the atomic system via an atomic transition using the photon and the received second electromagnetic radiation; emit the stored portion of the photon upon receiving third electromagnetic radiation; wherein, the apparatus is further configured to output the emitted portion of the field into the cavity. Optionally, the emitted portion of the field may be kept inside the cavity for further processing in consecutive circulations of the field in the cavity.

The first aspect may be adapted in any suitable way disclosed herein, including, but not limited to any one or more of the optional features for the second aspect and/or any one or more of the following.

The atomic system may comprise discrete energy states; the discrete energy states having a first energy state, a second energy state and a third energy state; the third energy state having a higher energy than the second energy state; the second energy state having a higher energy than the first energy state; the photonic memory configured to: I) receive the first electromagnetic radiation comprising the at least one photon; the photon having a field and a first frequency; the first frequency associated with a first energy; II) receive the second electromagnetic radiation, the second electromagnetic radiation having a second frequency; the second frequency corresponds to a second energy: a) such that the sum of the first energy and second energy corresponds to a resonance between the third and first energy states of the atomic system; b) that is different to the energy difference between the first and second energy states of the atomic system; c) that is different to the energy difference between the second and third energy states of the atomic system; III) use the second electromagnetic radiation to cause the photon to have at least a portion of its field stored in the atomic system by a portion of the atomic system's electrons transitioning between the first and third energy states; IV) receive the third electromagnetic radiation; the third electromagnetic radiation having a third frequency; the third frequency corresponding to a third energy: d) that is less than the energy difference between the first energy state and third energy state; e) that is different to the energy difference between the first and second energy states of the atomic system; f) that is different to the energy difference between the second and third energy states of the atomic system; V) use the third electromagnetic radiation to cause at least a part of the stored field portion to be emitted from the atomic system.

For example, if one photon is 100% absorbed, one electron gets excited (transitions from first to third state). However, if a photon gets partly absorbed, i.e. goes into a superposition of stored and transmitted, the electron is also in a superposition between excited and non-excited.

The atomic system may comprise an atomic ensemble. The atomic ensemble may comprise rubidium atoms. The atomic system may be accommodated in a vapour cell. The vapour cell may be accommodated within an optical fibre.

The above said photonic element for receiving second electromagnetic radiation from outside the photonic cavity may further receive the third EM radiation from outside the photonic cavity and direct the received third EM radiation into the photonic cavity.

The photonic element for receiving first electromagnetic radiation from outside the photonic cavity and the photonic element for receiving second electromagnetic radiation from outside the photonic cavity may be the same photonic element. This same photonic element may be an interferometer comprising a controllable phase modulator in at least one arm. This interferometer may be a Mach-Zehnder interferometer (MZI). The MZI may be an integrated optic MZI.

The interferometer may be photonically connected to a photonic loop, wherein the photonic loop is the photonic cavity; the loop for receiving EM radiation from the interferometer, passing the EM radiation around the loop and directing the said EM radiation back into the interferometer. The interferometer may transmit and receive EM radiation into and out of the loop from different optical inputs of the interferometer. The loop may comprise one or more lengths of optical fibre. The apparatus may be configured to direct the first EM radiation around the loop in an opposite direction to that of the second EM radiation. The apparatus may be configured to direct the third EM radiation around the loop in the same direction as the second EM radiation.

The apparatus may further comprise a first further photonic element for: A) receiving the first EM radiation from a first photonic source and directing the first EM radiation to the photonic element for transmitting the said received first electromagnetic radiation into the photonic cavity; B) receiving second EM radiation from the photonic element for transmitting the said received second electromagnetic radiation into the photonic cavity and directing it along a photonic path that is different to the photonic path used to receive the first EM radiation from the said first source.

The apparatus may further comprise a second further photonic element for: A) receiving the second EM radiation from a second photonic source and directing the second EM radiation to the photonic element for transmitting the said received second electromagnetic radiation into the photonic cavity; B) receiving first EM radiation from the photonic element for transmitting the said received first electromagnetic radiation into the photonic cavity and directing it along a photonic path that is different to the photonic path used to receive the second EM radiation from the said second source. The photonic path used to direct the said received first radiation may be used to direct the said first radiation to a photonic detector. The second further photonic element may receive the third EM radiation and direct the received third EM radiation towards the photonic element used to transmit the said received second electromagnetic radiation into the photonic cavity.

The first and second photonic elements may comprise wavelength multiplexers.

Associated with the first aspect there is also presented a method of storing and emitting one or more photons in a photonic memory comprising an atomic system, the photonic memory disposed in a photonic cavity; the photonic cavity formed by at least one photonic element; the method comprising: receiving first electromagnetic radiation, with at least one photonic element, from outside the photonic cavity and transmitting the said received first electromagnetic radiation into the photonic cavity; receiving second electromagnetic radiation, with at least one photonic element, from outside the photonic cavity and transmitting the said received second electromagnetic radiation into the photonic cavity; receiving, with the atomic system, at least one photon of the first electromagnetic radiation, the photon having a field; receiving, with the atomic system, the second electromagnetic radiation; storing at least a portion of the field of the photon in the atomic system via an atomic transition using the photon and the received second electromagnetic radiation; emitting the stored portion of the photon upon the atomic system receiving third electromagnetic radiation; outputting the emitted portion of the field into the photonic cavity.

This associated method of the first aspect may be adapted in any suitable way disclosed herein, including, but not limited to any one or more of the optional features described for the first aspect.

In a second aspect there is presented an apparatus for storing one or more photons, the apparatus comprises: I) a plurality of reflectors for reflecting electromagnetic radiation; at least two of the plurality of reflectors forming a photonic cavity; the plurality of reflectors comprising: at least one reflector for receiving first electromagnetic radiation from outside the photonic cavity and transmitting the said received first electromagnetic radiation into the photonic cavity; at least one reflector for receiving second electromagnetic radiation from outside the photonic cavity and transmitting the said received second electromagnetic radiation into the photonic cavity; II) a photonic memory disposed in the photonic cavity, the photonic memory comprising an atomic system configured to: receive at least one photon of first electromagnetic radiation, the photon having a field; receive second electromagnetic radiation; store at least a portion of the field of the photon in the atomic system via an atomic transition using the photon and the received second electromagnetic radiation; emit the stored portion of the photon upon receiving third electromagnetic radiation; the apparatus further configured to: direct the photon into the photonic memory, after being reflected into the photonic cavity by at least one of the plurality of reflectors; output the emitted portion of the field into the cavity.

The second aspect may be adapted in any suitable way disclosed herein, including, but not limited to any one or more of the optional features for the first aspect and/or any one or more of the following.

The apparatus may be configured such that the atomic system (106) comprises discrete energy states (108a 108b, 108c); the discrete energy states having a first energy state (108a), a second energy state (108b) and a third energy state (108c); the third energy state having a higher energy than the second energy state; the second energy state having a higher energy than the first energy state; the photonic memory configured to: receive the first electromagnetic radiation comprising the at least one photon (110); the photon having a field and a first frequency; the first frequency associated with a first energy; receive the second electromagnetic radiation (112), the second electromagnetic radiation having a second frequency; the second frequency corresponds to a second energy: such that the sum of the first energy and second energy corresponds to a resonance between the third and first energy states of the atomic system; that is different to the energy difference between the first and second energy states of the atomic system; that is different to the energy difference between the second and third energy states of the atomic system; use the second electromagnetic radiation to cause the photon to have at least a portion (110') of its field stored in the atomic system by a portion of the atomic system's electrons transitioning between the first and third energy states; receive the third electromagnetic radiation (114); the third electromagnetic radiation having a third frequency; the third frequency corresponding to a third energy: that is less than the energy difference between the first energy state and third energy state; that is different to the energy difference between the first and second energy states of the atomic system; that is different to the energy difference between the second and third energy states of the atomic system; use the third electromagnetic radiation to cause at least a part of the stored field portion to be emitted from the atomic system.

The apparatus may be configured such that the apparatus configured to change, within the photonic cavity, the photon from a first state to a second state; the first state and second state of the photon being different in at least one of: A) polarisation; B) wavelength.

wherein at least one of the plurality of reflectors is configured to transmit the photon in the first state and reflect the photon in the second state.

The apparatus may comprise: a first reflector for receiving first electromagnetic radiation from outside the photonic cavity and transmitting the said received first electromagnetic radiation into the photonic cavity; a second reflector for receiving second electromagnetic radiation from outside the photonic cavity and transmitting the said received second electromagnetic radiation into the photonic cavity;

The apparatus may comprise: a third reflector separate to the first and second reflectors, wherein the photonic cavity extends between the second and third reflectors; a polarisation rotator in the photonic cavity; wherein, the first reflector comprises a polarisation splitter; the first and second state of the photon being different at least in polarisation.

The polarisation rotator may be disposed between: the first and second reflector; or the first and third reflector.

A plurality of polarisation rotators may be used. Any one or more of the plurality of polarisation rotators may be disposed between: the first and second reflector; and/or the first and third reflector.

The photonic memory may be disposed between: the first and second reflector; or the first and third reflector.

A plurality of photonic memories may be used. Any one or more of the plurality of photonic memories be disposed between: the first and second reflector; and/or the first and third reflector.

The apparatus may comprise: a third reflector separate to the first and second reflectors, a polarisation rotator in the photonic cavity between the first and third reflectors; wherein, the photonic cavity extends between the second and third reflectors; the photonic memory being disposed between the first and second reflectors; the first reflector comprises a polarisation splitter; the first and second state of the photon being different at least in polarisation.

In principle, one can put the memory and the rotator between any combinations of the reflectors.

The apparatus may be configured such that the polarisation rotator comprises a Pockels cell.

The apparatus may be configured such that: the second and third reflectors reflect the photon in both the first and second states; the first reflector transmits the photon in the first state and reflects the photon in the second state.

The apparatus may be configured such that the first reflector comprises a polarisation splitter.

The apparatus may further comprise a photonic circulator outside of the photonic cavity and configured to: receive first electromagnetic radiation and transmit the said first electromagnetic radiation to the first reflector; receive the photon from the first reflector and output the photon to a detection apparatus.

The apparatus may be configured such that the polarisation rotator is configured to: receive the photon from the polarisation splitter apparatus in the first state; transmit the photon to the third reflector; receive the photon from the third reflector; output the photon towards the polarisation splitter in the second state.

The apparatus may be configured such that: the atomic system is configured to: store the photon in the first state comprising a first wavelength; emit the photon field in the second state, the second state comprising a different wavelength to the first wavelength; the first reflector and second reflectors are wavelength selective reflectors configured to reflect the wavelength of the second state and transmit the wavelength of the first state.

The apparatus may be configured such that the first and second reflectors are configured to transmit the second and third electromagnetic radiation.

The apparatus may be configured such that: the first reflector comprises fibre Bragg grating; the second reflector comprises fibre Bragg grating.

Associated with the second aspect there is also presented a method of storing one or more photons in a photonic memory and emitting one or more photons from the photonic memory, the photonic memory comprising an atomic system, the photonic memory disposed in a photonic cavity; the photonic cavity formed by at least two of a plurality of reflectors for reflecting electromagnetic radiation; the method comprising: receiving first electromagnetic radiation, by at least one of the said reflectors, from outside the photonic cavity and transmitting the said received first electromagnetic radiation into the photonic cavity; receiving second electromagnetic radiation, by at least one of the said reflectors, from outside the photonic cavity and transmitting the said received second electromagnetic radiation into the photonic cavity; and in any order: A) receiving, with the atomic system, at least one photon of the first electromagnetic radiation, the photon having a field; receiving, with the atomic system, the second electromagnetic radiation; storing at least a portion of the field of the photon in the atomic system via an atomic transition using the photon and the received second electromagnetic radiation; emitting the stored portion of the photon upon the atomic system receiving third electromagnetic radiation; B) directing the photon into the photonic memory, after being reflected into the photonic cavity by at least one of the plurality of reflectors; and then: outputting the emitted portion of the field into the photonic cavity.

This associated method of the first aspect may be adapted in any suitable way disclosed herein, including, but not limited to any one or more of the optional features described for the first or second aspects.

In a third aspect there is presented an apparatus (102) comprising one or more photonic memories (104): wherein a first photonic memory (104a) comprising an atomic system (106) having discrete energy states (108a 108b, 108c); the discrete energy states having a first energy state (108a), a second energy state (108b) and a third energy state (108c); the third energy state having a higher energy than the second energy state; the second energy state having a higher energy than the first energy state; the first photonic memory configured to: receive first electromagnetic, EM, radiation comprising at least one photon (110); the photon having a field and a first frequency; the first frequency associated with a first energy; receive second electromagnetic radiation (112), the second electromagnetic radiation having a second frequency; the second frequency corresponds to a second energy: such that the sum of the first energy and second energy corresponds to a resonance between the third and first energy states of the atomic system; that is different to the energy difference between the first and second energy states of the atomic system; that is different to the energy difference between the second and third energy states of the atomic system; use the second electromagnetic radiation to cause the photon to have at least a portion (110') of its field stored in the atomic system by a portion of the atomic system's electrons transitioning between the first and third energy states; receive third electromagnetic radiation (114); the third electromagnetic radiation having a third frequency; the third frequency corresponding to a third energy: that is less than the energy difference between the first energy state and third energy state; that is different to the energy difference between the first and second energy states of the atomic system; that is different to the energy difference between the second and third energy states of the atomic system; use the third electromagnetic radiation to cause at least a part of the stored field portion to be emitted from the atomic system; the apparatus further configured to store the field portion of the photon emitted by the atomic system in the one or more photonic memories.

The third aspect may be adapted in any suitable way disclosed herein, including, but not limited to any one or more of the optional features for the first or second aspects and/or any one or more of the following.

The apparatus may further comprise one or more photonic elements; the one or more photonic elements comprising: at least one photonic element forming part of a photonic cavity; the first photonic memory disposed in the photonic cavity; at least one photonic element for receiving first electromagnetic radiation from outside the photonic cavity and transmitting the said received first electromagnetic radiation into the photonic cavity; at least one photonic element for receiving second electromagnetic radiation from outside the photonic cavity and transmitting the said received second electromagnetic radiation into the photonic cavity; the apparatus may be further configured to output the emitted portion of the field into the cavity.

The apparatus may be configured such that the photonic element for receiving second electromagnetic radiation from outside the photonic cavity may further receive the third EM radiation from outside the photonic cavity and direct the received third EM radiation into the photonic cavity.

The apparatus may be configured such that the photonic element for receiving first electromagnetic radiation from outside the photonic cavity and the photonic element for receiving second electromagnetic radiation from outside the photonic cavity are the same photonic element.

The apparatus may be configured such that the said same photonic element comprises an interferometer comprising a controllable phase modulator in at least one arm.

The apparatus may be configured such that the photonic cavity is a photonic loop cavity.

The apparatus may be configured such that the photonic loop cavity receives first and second EM radiation from the interferometer, passes the first and second EM radiation around the loop and directs the said first and second EM radiation back into the interferometer.

The apparatus may be configured such that the interferometer transmits and receives first and second EM radiation into and out of the loop from different inputs of the interferometer.

The photonic loop may comprise one or more lengths of optical fibre.

The apparatus may be configured to direct the first EM radiation around the loop in an opposite direction to that of the second EM radiation.

The apparatus may be configured to direct the third EM radiation around the loop in the same direction as the second EM radiation.

The apparatus may further comprise a first further photonic element for: A) receiving the first EM radiation from a first photonic source and directing the first EM radiation to the photonic element for transmitting the said received first electromagnetic radiation into the photonic cavity; B) receiving second EM radiation from the photonic element for transmitting the said received second electromagnetic radiation into the photonic cavity and directing it along a photonic path that is different to the photonic path used to receive the first EM radiation from the said first source.

The apparatus may further comprise a second further photonic element for: A) receiving the second EM radiation from a second photonic source and directing the second EM radiation to the photonic element for transmitting the said received second electromagnetic radiation into the photonic cavity; B) receiving first EM radiation from the photonic element for transmitting the said received first electromagnetic radiation into the photonic cavity and directing it along a photonic path that is different to the photonic path used to receive the second EM radiation from the said second source.

The photonic path used to direct the said received first radiation may be used to direct the said first radiation to a photonic detector.

The second further photonic element may receive the third EM radiation and direct the received third EM radiation towards the photonic element used to transmit the said received second electromagnetic radiation into the photonic cavity.

The first and second photonic elements may comprise wavelength multiplexers.

The first and second electromagnetic radiation may be different in one or more photonic properties including having different polarisations and/or having different frequencies.

The atomic system may comprise an atomic ensemble.

The first, second and third energy states may be associated with energy levels of electrons.

The apparatus may be configured such that the atomic system comprises an atomic ensemble comprising rubidium atoms.

The atomic system may be accommodated in a vapour cell. The vapour cell may be accommodated within an optical fibre.

The frequencies of the first and second EM radiation may be different.

The frequencies of the first and third EM radiation may be different. The frequencies of the second and third EM radiation maybe the same. The sum of the first energy and third energy may correspond to a resonance between the third and first energy states of the atomic system.

The third EM radiation may comprise a photon flux such that the field portion stored in the atomic ensemble is in a superposition of: a) being stored by the atomic ensemble; and, b) being emitted by the atomic ensemble.

The apparatus may also be configured such that the part of the stored field portion emitted from the atomic system is input back into the atomic system.

The apparatus may also comprise a system for inputting the first EM radiation into the atomic assembly. The system may comprise a single photon generating source.

Associated with the third aspect is also presented a method of storing one or more photons in one or more photonic memories and emitting one or more photons from the said photonic memories, at least a first of the one or more photonic memories comprising an atomic system having discrete energy states; the discrete energy states having a first energy state, a second energy state and a third energy state; the third energy state having a higher energy than the second energy state; the second energy state having a higher energy than the first energy state; the method comprising: I) receiving first electromagnetic, EM, radiation comprising at least one photon; the photon having a field and a first frequency; the first frequency associated with a first energy; II) receiving second electromagnetic radiation, the second electromagnetic radiation having a second frequency; the second frequency corresponds to a second energy: i) such that the sum of the first energy and second energy corresponds to a resonance between the third and first energy states of the atomic system; ii) that is different to the energy difference between the first and second energy states of the atomic system; iii) that is different to the energy difference between the second and third energy states of the atomic system; III) using the second electromagnetic radiation to cause the photon to have at least a portion of its field stored in the atomic system by a portion of the atomic system's electrons transitioning between the first and third energy states; IV) receiving third electromagnetic radiation; the third electromagnetic radiation having a third frequency; the third frequency corresponding to a third energy: iv) that is less than the energy difference between the first energy state and third energy state; v) that is different to the energy difference between the first and second energy states of the atomic system; vi) that is different to the energy difference between the second and third energy states of the atomic system; V) using the third electromagnetic radiation to cause at least a part of the stored field portion to be emitted from the atomic system; VI) storing the field portion of the photon emitted by the atomic system in the one or more photonic memories.

This associated method of the third aspect may be adapted in any suitable way disclosed herein, including, but not limited to any one or more of the optional features described for the first or second third aspects.

The apparatus of the third aspect may also be adapted according to any one or more of the following.

The apparatus may comprise a set of two or more photonic elements; wherein: I) at least a first one or more of the photonic elements: a) receives the first EM radiation from a first photonic source from a first photonic path and directs the first EM radiation along a second photonic path towards the first photonic memory; b) receives second and/or third EM radiation from the first photonic memory along the second photonic path and directs the second and/or third EM radiation along a third photonic path that is different to the second photonic path; and, II) at least a second one or more of the photonic elements: c) receives the first EM radiation from the one or more photonic memories along a fourth photonic path and directs the received first EM radiation along a firth photonic path; d) receives second and/or third EM radiation from one or more second photonic sources from a sixth photonic path and directs the received second and/or third EM radiation towards the one or more photonic memories; the sixth photonic path different to the fifth photonic path.

The apparatus may comprise a plurality of photonic memories photonically linked in between: the first one or more of the photonic elements, and the second one or more of the photonic elements.

The apparatus may comprise one or more third photonic elements photonically linked to and disposed between two or more successive photonic memories; the third photonic elements configured to: a) receive first EM radiation from at least one of the photonic memories and output the received first EM radiation to at least a further, different, one or more of the photonic memories; b) receive, along a photonic path different to the photonic path used for receiving the first EM radiation by the third photonic element, second and/or third EM radiation intended for the said at least one of the photonic memories; c) receive second or third EM radiation output from the said different one or more photonic memories and direct the said received second or third EM radiation away from the said at least one of the photonic memories.

The apparatus may comprise at least two of the third elements in between adjacent photonic memories.

Any one or more of the photonic elements may comprise a wavelength filter, such as but not limited to a dichroic mirror.

The one or more photonic memories may be photonically linked in a series comprising a plurality of photonic memories. The series may be photonically linked and disposed between a first wavelength filter and a second wavelength filter; each wavelength filter for separating first EM radiation from second/third EM radiation.

The apparatus may comprise a third a fourth wavelength filter photonically linked and disposed between two adjacent photonic memories in the series wherein each wavelength filter for separating first EM radiation from second/third EM radiation.

According to a fourth aspect there is provided an apparatus for storing one or more photons, the apparatus comprises: I) a plurality of photonic elements for reflecting electromagnetic radiation; at least two of the plurality of photonic elements forming a photonic cavity; the plurality of photonic elements comprising: at least one photonic element for receiving first electromagnetic radiation from outside the photonic cavity and transmitting the said received first electromagnetic radiation into the photonic cavity; at least one photonic element for receiving second electromagnetic radiation from outside the photonic cavity and transmitting the said received second electromagnetic radiation into the photonic cavity; II) a photonic memory disposed in the photonic cavity, the photonic memory comprising an atomic system configured to: receive at least one photon of first electromagnetic radiation, the photon having a field; receive second electromagnetic radiation and third electromagnetic radiation; store at least a portion of the field of the photon in the atomic system via an atomic transition using the photon and the received second electromagnetic radiation; emit the stored portion of the field of the photon upon receiving the third electromagnetic radiation; the apparatus further configured to: direct the photon into the photonic memory, after being reflected back into the photonic cavity by at least one of the plurality of photonic elements; output the emitted portion of the field into the cavity; control the photon flux density of the third electromagnetic radiation to control the superposition of the said stored field portion of the photon in the states of: a) continued storage by the atomic system; b) emitted by the atomic system.

The fourth aspect may be adapted in any suitable way disclosed herein, including, but not limited to any one or more of the optional features for the first or second or third aspects and/or any one or more of the following.

The apparatus may be configured such that the atomic system comprises discrete energy states; the discrete energy states having a first energy state, a second energy state and a third energy state; the third energy state having a higher energy than the second energy state; the second energy state having a higher energy than the first energy state; the photonic memory configured to: I) receive the first electromagnetic radiation comprising the at least one photon; the photon having a field and a first frequency; the first frequency associated with a first energy; II) receive the second electromagnetic radiation, the second electromagnetic radiation having a second frequency; the second frequency corresponds to a second energy: a) such that the sum of the first energy and second energy corresponds to a resonance between the third and first energy states of the atomic system; b) that is different to the energy difference between the first and second energy states of the atomic system; c) that is different to the energy difference between the second and third energy states of the atomic system; III) use the second electromagnetic radiation to cause the photon to have at least a portion of its field stored in the atomic system by a portion of the atomic system's electrons transitioning between the first and third energy states; IV) receive the third electromagnetic radiation; the third electromagnetic radiation having a third frequency; the third frequency corresponding to a third energy: d) that is less than the energy difference between the first energy state and third energy state; e) that is different to the energy difference between the first and second energy states of the atomic system; f) that is different to the energy difference between the second and third energy states of the atomic system; V) use the third electromagnetic radiation to cause at least a part of the stored field portion to be emitted from the atomic system.

The apparatus may be configured such that the apparatus is configured to change, within the photonic cavity, the photon from a first state to a second state; the first state and second state of the photon being different in at least one of: A) polarisation; B) wavelength; wherein at least one of the plurality of photonic elements is configured to transmit the photon in the first state and reflect the photon in the second state.

The apparatus may comprise: a first photonic element for receiving first electromagnetic radiation from outside the photonic cavity and transmitting the said received first electromagnetic radiation into the photonic cavity; a second photonic element for receiving second electromagnetic radiation from outside the photonic cavity and transmitting the said received second electromagnetic radiation into the photonic cavity. The apparatus may comprise: a third photonic element separate to the first and second photonic elements, wherein the photonic cavity extends between the second and third photonic elements; a polarisation rotator in the photonic cavity; wherein, the first photonic element comprises a polarisation splitter; the first and second state of the photon being different at least in polarisation. The apparatus may be configured such that the polarisation rotator comprises a Pockels cell.

The apparatus may be configured such that: the second and third photonic elements reflect the photon in both the first and second states; the first photonic element transmits the photon in the first state and reflects the photon in the second state.

The apparatus may be configured such that the first photonic element comprises a polarisation splitter. The apparatus may further comprise a photonic circulator outside of the photonic cavity and configured to: receive first electromagnetic radiation and transmit the said first electromagnetic radiation to the first photonic element; receive the photon from the first photonic element and output the photon to a detection apparatus. The apparatus may be configured such that the polarisation rotator is configured to: receive the photon from the polarisation splitter apparatus in the first state; transmit the photon to the third photonic element; receive the photon from the third photonic element; output the photon towards the polarisation splitter in the second state.

The apparatus may be configured such that: the atomic system is configured to: store the photon in the first state comprising a first wavelength; emit the photon field in the second state, the second state comprising a different wavelength to the first wavelength; the first photonic element and second photonic element are wavelength selective reflectors configured to reflect the wavelength of the second state and transmit the wavelength of the first state. The apparatus may be configured such that the first and second photonic elements are configured to transmit the second and third electromagnetic radiation. The apparatus may be configured such that: the first photonic element comprises fibre Bragg grating; the second photonic element comprises fibre Bragg grating.

The apparatus may be configured such that the atomic system comprises an atomic ensemble comprising rubidium atoms. The apparatus may further comprise a control system for controlling the photon flux density of any of the second and third electromagnetic radiation. The apparatus may be configured such that the control system is further configured to control temporal pulse widths of any of the second and third electromagnetic radiation. The control system may receive input signals including, but not limited to feedback signals, such as electrical signals from a photon detector, that are used to determine any of: the timing, temporal width and optical power of the electromagnetic read in/out pulses. The control system may comprise one or more electronic processors to determine any of the above parameters from the received input signals and/or any other stored data for determining the operation of the apparatus. The apparatus may be configured such that the apparatus controls the photon flux density of any of: the second electromagnetic radiation; the third electromagnetic radiation; based on a feedback signal from an optical detector detecting a further photon previously output by the atomic system.

The apparatus may be configured such that the photonic element for receiving second electromagnetic radiation from outside the photonic cavity further receives the third electromagnetic radiation from outside the photonic cavity and directs the received third electromagnetic radiation into the photonic cavity.

The apparatus may be configured such that the photonic element for receiving first electromagnetic radiation from outside the photonic cavity and the photonic element for receiving second electromagnetic radiation from outside the photonic cavity are the same photonic element. The apparatus may be configured such that the said same photonic element comprises an interferometer comprising a controllable phase modulator in at least one arm. The apparatus may be configured such that the photonic cavity is a photonic loop cavity.

The apparatus may be configured such that the photonic loop cavity receives first and second EM radiation from the interferometer, passes the first and second EM radiation around the loop and directs the said first and second EM radiation back into the interferometer. The apparatus may be configured such that the interferometer transmits and receives first and second EM radiation into and out of the loop from different inputs of the interferometer. The apparatus may be configured to direct the first EM radiation around the loop in an opposite direction to that of the second EM radiation.

Associated with the fourth aspect is a method of storing one or more photons in a photonic memory and emitting one or more photons from the photonic memory, the photonic memory comprising an atomic system, the photonic memory disposed in a photonic cavity; the photonic cavity formed by at least two of a plurality of photonic elements for reflecting electromagnetic radiation; the method comprising: receiving first electromagnetic radiation, by at least one of the said photonic elements, from outside the photonic cavity and transmitting the said received first electromagnetic radiation into the photonic cavity; receiving second electromagnetic radiation, by at least one of the said photonic elements, from outside the photonic cavity and transmitting the said received second electromagnetic radiation into the photonic cavity; and in any order: A) receiving, with the atomic system, at least one photon of the first electromagnetic radiation, the photon having a field; receiving, with the atomic system, the second electromagnetic radiation; storing at least a portion of the field of the photon in the atomic system via an atomic transition using the photon and the received second electromagnetic radiation; emitting the stored portion of the photon upon the atomic system receiving third electromagnetic radiation; B) directing the photon into the photonic memory, after being reflected into the photonic cavity by at least one of the plurality of photonic elements; and then: outputting the emitted portion of the field into the photonic cavity; C) controlling the photon flux density of the third electromagnetic radiation to control the superposition of the stored field portion of the photon in the states of: a) continued storage by the atomic system; b) emitted by the atomic system.

There is further provided in accordance with a fifth aspect an apparatus comprising a plurality of photonic memories; the plurality of photonic memories comprising at least a first photonic memory and a second photonic memory: wherein the first photonic memory comprises an atomic system having discrete energy states; the discrete energy states having a first energy state, a second energy state and a third energy state; the third energy state having a higher energy than the second energy state; the second energy state having a higher energy than the first energy state; the first photonic memory configured to: receive first electromagnetic, EM, radiation comprising at least one photon; the photon having a field and a first frequency; the first frequency associated with a first energy; receive second electromagnetic radiation, the second electromagnetic radiation having a second frequency; the second frequency corresponds to a second energy: such that the sum of the first energy and second energy corresponds to a resonance between the third and first energy states of the atomic system; that is different to the energy difference between the first and second energy states of the atomic system; that is different to the energy difference between the second and third energy states of the atomic system; use the second electromagnetic radiation to cause the photon to have at least a portion of its field stored in the atomic system by a portion of the atomic system's electrons transitioning between the first and third energy states; receive third electromagnetic radiation; the third electromagnetic radiation having a third frequency; the third frequency corresponding to a third energy: that is less than the energy difference between the first energy state and third energy state; that is different to the energy difference between the first and second energy states of the atomic system; that is different to the energy difference between the second and third energy states of the atomic system; use the third electromagnetic radiation to cause at least a part of the stored field portion to be emitted from the atomic system; the apparatus further configured to store at least a part of the field portion of the photon, emitted by the atomic system of the first photonic memory, in the second photonic memory.

The fifth aspect may be adapted in any suitable way disclosed herein, including, but not limited to any one or more of the optional features for the first or second or third aspects and/or any one or more of the following.

The apparatus may be configured such that the second photonic memory comprises an atomic system having discrete energy states. The apparatus may be configured such that the second photonic memory is configured to store and subsequently emit the said field portion of the photon emitted by the first photonic memory using further electromagnetic radiation.

The apparatus may be further configured to control the photon flux density of the third electromagnetic radiation to control the superposition of the said stored field portion of the photon in the states of: a) continued storage by the atomic system of the first photonic memory; b) emitted by the atomic system of the first photonic memory.

The apparatus may be configured such that the first photonic memory controllably emits photons independently from the second photonic memory. Thus, the apparatus may be configured such that the first and second photonic memories are independently controllable for emitting the photon. The apparatus may be configured such that the first photonic memory controllably stores photons independently from the second photonic memory. Thus, the apparatus may be configured such that the first and second photonic memories are independently controllable for storing the photon.

The apparatus may further comprise one or more photonic elements; the one or more photonic elements comprising: at least one photonic element forming part of a photonic cavity; the first photonic memory disposed in the photonic cavity; at least one photonic element for receiving first electromagnetic radiation from outside the photonic cavity and transmitting the said received first electromagnetic radiation into the photonic cavity; at least one photonic element for receiving second electromagnetic radiation from outside the photonic cavity and transmitting the said received second electromagnetic radiation into the photonic cavity; the apparatus may be further configured to output the emitted portion of the field into the cavity.

The apparatus may further comprise a first further photonic element for: A) receiving the first EM radiation from a first photonic source and directing the first EM radiation to the photonic element for transmitting the said received first electromagnetic radiation into the photonic cavity; B) receiving second EM radiation from the photonic element for transmitting the said received second electromagnetic radiation into the photonic cavity and directing it along a photonic path that is different to the photonic path used to receive the first EM radiation from the said first source.

The apparatus may further comprise a second further photonic element for: A) receiving the second EM radiation from a second photonic source and directing the second EM radiation to the photonic element for transmitting the said received second electromagnetic radiation into the photonic cavity; B) receiving first EM radiation from the photonic element for transmitting the said received first electromagnetic radiation into the photonic cavity and directing it along a photonic path that is different to the photonic path used to receive the second EM radiation from the said second source.

The apparatus may be configured such that the first photonic memory and the second photonic memory each comprise an atomic ensemble comprising rubidium atoms.

BRIEF DESCRIPTION OF THE FIGURES

FIG. 3 shows an example of an atomic system for use with the apparatus described herein;
FIG. 4a-4d show example operations of an apparatus described herein;
FIG. 5 shows an example of an apparatus that may be used for boson sampling;
FIGS. 6a-6b and 7 shows an example of an apparatus being used for two-photon interference;
FIG. 13a-d show an example of how a potential series of operations can be used to manipulate the signal photon time bins for an apparatus;
FIGS. 14a and 14b show an example of an apparatus;
FIG. 15a shows an example set-up of an apparatus;
FIG. 15b shows an example of a graphical representation showing the optical frequency response of Bragg filters of the apparatus of FIG. 15a;
FIG. 15c shows a schematic example of the energy levels of the atomic assembly used in the apparatus of FIG. 15a.

DESCRIPTION

Figure 2:
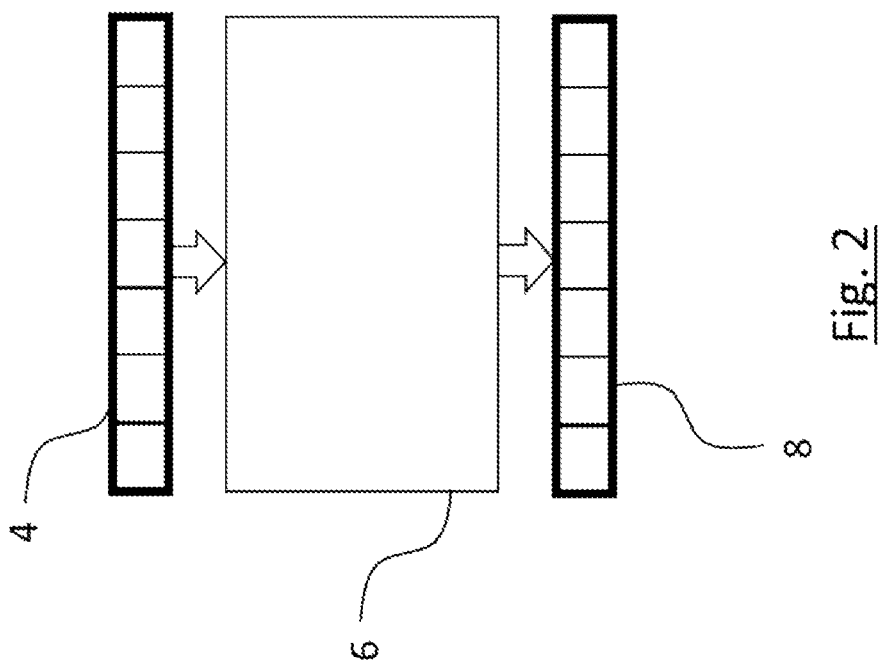
FIG. 2 shows a schematic example of the boson sampling principle.
Figure 1:
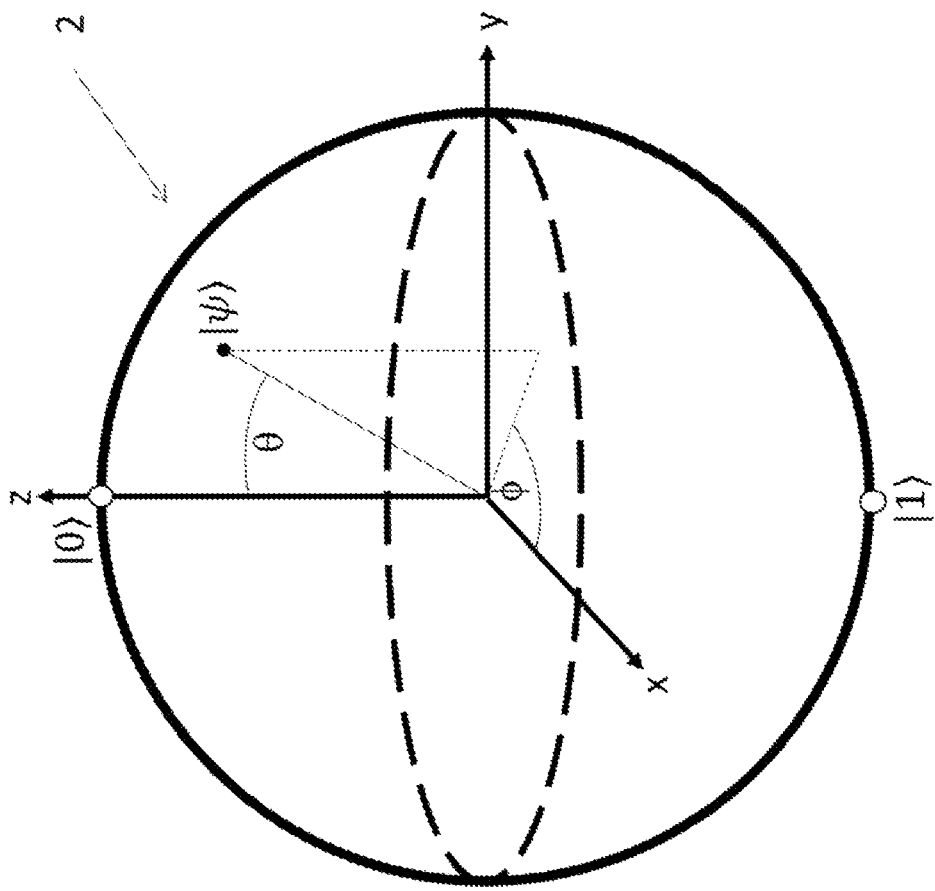
FIG. 1 shows a Bloch sphere.

There is presented an apparatus comprising one or more photonic memories. A first photonic memory (104a) comprises an atomic system (106) having discrete energy states (108a 108b, 108c), which may be termed 'energy levels'. FIG. 3 shows an example of an atomic system, however other examples may be used. The discrete energy states have a first energy state (108a), a second energy state (108b) and a third energy state (108c). The third energy state has a higher energy than the second energy state. The second energy state has a higher energy than the first energy state. The first photonic memory is configured to receive first electromagnetic radiation comprising at least one photon (110); the photon having a field and a first frequency; the first frequency associated with a first energy. The first photonic memory is further configured to receive second electromagnetic radiation (112), the second electromagnetic radiation having a second frequency. The second frequency corresponds to a second energy: a) such that the sum of the first energy and second energy corresponds to a resonance between the third and first energy states of the atomic system; b) that is different to the energy difference between the first and second energy states of the atomic system; c) that is different to the energy difference between the second and third energy states of the atomic system.

The first photonic memory is further configured to use the second electromagnetic radiation to cause the photon to have at least a portion (110') of its field stored in the atomic system by one or more electrons transitioning between the first and third energy states. The first photonic memory is further configured to receive third electromagnetic radiation (114); the third electromagnetic radiation having a third frequency. The third frequency corresponding to a third energy: a) that is less than the energy difference between the first energy state and third energy state; b) that is different to the energy difference between the first and second energy states of the atomic system; c) that is different to the energy difference between the second and third energy states of the atomic system. The first photonic memory is further configured to use the third electromagnetic radiation to cause at least a part of the stored field portion to be emitted from the atomic system. The apparatus is further configured to store the field portion of the photon emitted by the atomic system in the one or more photonic memories.

The apparatus may therefore be used to store photons from the first electromagnetic (EM) radiation either in a deterministic manner or in a superposition state. The superposition state of a photon having components of both being stored and not stored. This is accomplished using a two (or more) photon resonance transition between the first and third energy states of the atomic system wherein, individually, the first energy and the second energy correspond to off-resonant transitions of the atomic system. The target photon to be stored in the system may be termed the signal photon or 'signal' whilst the EM radiation used to controllably store or emit the signal photon may be referred to as the control pulse, or suitably 'read-in' or 'read-out' pulses.

FIG. 3 shows an example of such a ladder-based system wherein the energy states of the atomic system are energy levels of valence electrons of an atomic ensemble, however other energy levels and atomic systems may be used by the apparatus. To store the photon in the atomic system, the first and second EM radiation temporally overlap in the atomic system. As well as the photon from the first EM radiation being stored, a photon from the second EM radiation is also stored via the two-photon resonance.

In this example, the first energy state 108a of the atomic system is the 5S energy level, the second energy state 108b is the 5P energy level and the third energy state 108c is the 5D energy level. Neither of the photon energies of the first and second electromagnetic radiation correspond to the atomic transitions between the first and second levels or between the second and third energy levels. Instead the frequencies correspond to off resonant transitions such that the photon from the first radiation corresponds to a transition from the first level 5S to an off-resonance level 108d above the 5P level. Similarly, a photon from the second EM radiation corresponds to a transition from the off-resonance level to the third level 5D. This example is not limited to such an off-resonance level. The off-resonance level may be above or below the second energy state 5P. Either of the transitions between a) the first energy level and the off resonance level; and, b) the off resonance level and the third energy level, may correspond to the frequencies of any of the first, second and third radiation provided the overall resonance condition applies, which in this example is a two-photon resonance condition. The operation to store or release a photon from the atomic system may in principle involve two or more photons each from one or more sources of EM radiation. Furthermore, in this example the frequencies of the first and second EM radiation are different, however they may be the same.

Upon receiving the third EM radiation, the atomic system is stimulated to emit the stored photon to be further stored by a further photon storage function in the apparatus. Upon emitting the photon of the first EM radiation, the photon of the second EM radiation used in the two-photon resonance is also emitted.

Typically, the second and third electromagnetic radiation are pulses of EM radiation, however continuous wave (CW) operation is also feasible. Typically, the first EM radiation is a single photon, however multiphoton states may also be input into the atomic system. The single photon may also be part of a train of single photons temporally separated into different time bins. The frequencies of the first and third EM radiation in this example are different, however they may be the same. In this example, the frequencies of the second and third EM radiation are the same. In such a case the sum of the first energy and third energy corresponds to a resonance between the third and first energy states of the atomic system. Alternatively, the second and third EM radiation frequencies (hence energies) may be different. Where the frequencies of the second and third radiation are different, the stored photon of the first EM radiation is output at a different frequency to its first frequency when it was initially input to the atomic system. When operating the apparatus in this manner, the apparatus may be a wavelength converter.

As described above, the stored photon may be deterministically stored or non-deterministically stored. This typically depends primarily on the photon flux of the second EM radiation. The higher the number of photons in the second EM signal, the greater the probability that the photon of the first EM signal is stored. The number of photons in the second and third signal affecting the storage, transmission or release of a photon may be referred to as the photon flux (the number of photons per second) of the incident EM radiation.

In circumstances where the second EM radiation has a photon flux that may either store the first EM photon or allow the first EM photon to be transmitted through the atomic system, the photon has field components in both of these states and therefore is in a quantum superposition until the superposition state collapses, for example by being measured by a detector. By allowing the photon to be in a quantum superposition, the apparatus may therefore transform the photon from a classical bit 'cbit' into a qubit. The higher the photon flux of the second EM pulse, the greater the probability that the photon is in the stored field portion. Controlling the photon flux of the second EM pulse therefore controls the probability amplitudes of the qubit basis states. Here the basis states of the photon qubit are temporally encoded, i.e. being stored for later emission is one time bin state, or transmitted (not stored) is a different time bin state.

When the third EM pulse is incident upon the atomic system, after the first EM pulse, the portion of the photon field being stored by the atomic system may be emitted or may remain stored. The third EM radiation may comprise a photon flux such that the field portion stored in the atomic ensemble is in a superposition of: a) being stored by the atomic ensemble; and, b) being emitted by the atomic ensemble. Thus, similar to the second EM pulse, the third EM pulse may have a photon flux that either deterministically outputs the stored portion of the photon field or places that stored portion in a quantum superposition of being continually stored in the atomic system or emitted from the atomic system.

The further storage function may be a further photonic memory or the same photonic memory that the photon was emitted from. The further photonic memory may be a photonic memory similar to the first photonic memory. The apparatus may also be configured such that the part of the stored field portion emitted from the atomic system is input back into the atomic system. This may be via an optical fibre feedback loop or other light path system. Examples showing an apparatus with such a feedback as described elsewhere herein.

FIGS. 4a-4d show examples of how an atomic system 106 of the apparatus 104 may be used to controllably store the photon 110 of the first EM radiation. In each example, dashed boxes at three different time snapshots are shown starting with T0 and ending in T2. The figures are schematic representations intended to show, for conceptual understanding purposes, how the apparatus 104 may operate.

In these examples, the frequency of the photon of the first EM radiation is different to the frequency of the second and third EM radiation. The second and third EM radiation have identical frequencies and originate from the same optical source. As described above, a photon of the second EM radiation is also stored by the atomic system during the two-photon resonance absorption process to store the first photon of the first EM radiation, however this is not shown in the figures.

In FIG. 4a, at time T0, a photon 110 of the first EM radiation is incident upon the atomic system 106 at the same time as a pulse of the second EM radiation is input into the atomic system. The two EM radiations are input such that they are incident substantially simultaneously so that at least a portion of the first and second EM radiation temporally overlap within the atomic system. The photon flux of the second EM radiation is high enough such that a photon of the second EM radiation and a photon of the first EM radiation is stored via a two-photon resonance transition between the first and third energy states of the atomic system.

At time T1 of FIG. 4a the photon 110 of the first EM radiation is stored and third EM radiation 114, sent as a pulse, is input into the atomic system 106. The third EM radiation pulse has a high enough photon flux to deterministically emit the first photon 110 (as well as the stored photon of the second EM radiation, not shown). The emission of the photon 110 of the first EM radiation is shown at time T2 of FIG. 4a wherein the said photon 110 is being input into a further photonic memory 106a.

FIG. 4b shows an example similar to that of FIG. 4a except that at time T0, the second EM radiation pulse 112 has a lower photon flux such that there is a probability that the stored photon 110 is emitted and a probability that the stored photon 110 is not emitted and remains stored. This is shown at T1 where the photon field is split into a stored component 110' and an emitted component 110" before the third EM radiation pulse 114 is input into the atomic system. The third EM pulse 114 is similar to that of FIG. 4a and deterministically outputs all of the stored photon field 110' of the first EM radiation to a further photonic memory 106a as shown in FIG. 4b T2. In this example the photon 110 has field components 110', 110" propagating in two different time bins.

FIG. 4c shows an example similar to that of FIG. 4b except that at time T1, the third EM radiation pulse 114 has a lower photon flux such that there is a probability that the stored component 110' of the photon 110 has a probability of remaining stored (not emitted) and a probability of being emitted. This is shown at T2 where the photon field is split again into a stored component 110''' remaining stored after the third EM pulse and an emitted component 110'''' emitted as a result of the third EM pulse. In this example the photon 110 has field components occupying three different time bins, namely, the transmitted component 110" that was not stored by the pulse of the second EM radiation; the emitted component 110'''' initially stored by the pulse of second EM radiation but then emitted from the memory 106 by the pulse of third EM radiation; the remaining portion 110''' stored by the second EM radiation pulse and not emitted by the third EM radiation pulse.

FIG. 4d shows an example similar to that of FIG. 4b except that at time T2, the initial stored component 110' is deterministically emitted by the introduction of the third EM radiation pulse and is fed back into the same atomic system 106 from which it was emitted. The portion of the photon field 110' is shown to feedback into the atomic system 106 in the same input direction as the first EM radiation where the photon 110 was input into the memory 106 previously. When this field portion 110' of the first photon 110 is incident upon the atomic system 106, a fourth EM radiation may be simultaneously input into the photonic system that may act to store at least a portion of the field portion 110' in the atomic system 106 again. Similarly, such a fourth EM radiation pulse may be used with the further photonic memory 106a in FIGS. 4a-4c. If the pulse of the third EM radiation had a lower photon flux such that only a portion of the stored photon field 110' was emitted then the portion emitted and fed back into the memory would interfere, via two photon (Hong-Ou-Mandel) interference with the field portion that was held in the memory 106. Hence, in this alternative to FIG. 4d, a portion is continually stored in a similar manner to FIG. 4c where the initial stored portion 110' becomes continually stored portion 110''' and emitted portion 110'''' is output but feeds back into the memory 106 again, interfering with the stored portion 110'''.

The apparatus may therefore also comprise a second photonic memory (104a) comprising a further atomic system (106a) having discrete energy states (108a 108b, 108c). This second photonic memory is an example similar to the first photonic memory and any optional features described for the first photonic memory may be applied to the second photonic memory. Furthermore, other photonic memories may be used instead or/aswell as this second photonic memory. The discrete energy states have a first energy state (108a), a second energy state (108b) and a third energy state (108c).

The third energy state has a higher energy than the second energy state. The second energy state has a higher energy than the first energy state. The second photonic memory is configured to receive the part of the photon field emitted from the first photonic memory (104). The second photonic memory is further configured to receive fourth electromagnetic radiation, the fourth electromagnetic radiation having a fourth frequency. The fourth EM radiation may have the same optical properties as the second or third EM radiation and/or may be generated by the same sources as the second or third EM radiation. The fourth radiation may also have one or more optical properties that are different to the other second or third EM radiation. The fourth frequency corresponds to a fourth energy: a) such that the sum of the energy of the said part of the photon field and fourth energy corresponds to a resonance between the third and first energy states of the further atomic system; b) that is different to the energy difference between the first and second energy states of the further atomic system; c) that is different to the energy difference between the second and third energy states of the further atomic system. The second photonic memory is further configured to use the fourth electromagnetic radiation to cause the said part of the photon field to have at least a portion of its field stored in the atomic system by one or more electrons transitioning between the first and third energy states.

Just as the first photonic memory 104 stores photons deterministically or in a time bin encoded quantum superposition, so can other photonic memories.

The apparatus may therefore have a plurality of photonic memories similar to the first photonic memory. These photonic memories are optically linked such that part of the photon field stored and emitted from one photonic memory is input into a second photonic memory. Some photonic memories after the first photonic memory may be other forms of photonic memory including, for example Raman based memories. This allows the apparatus to controllably select photon field components to be emitted and further stored in a series of photonic memories.

In a similar manner to the first photonic memory, the second photonic memory may also be configured to: receive fifth electromagnetic radiation (114). The fifth electromagnetic radiation having a fifth frequency. The fifth EM radiation may have the same optical properties as the second, third or fourth EM radiation and/or may be generated by the same sources as the second or third EM radiation. The fifth radiation may also have one or more optical properties that are different to the other second, third or fourth EM radiation. The fifth frequency corresponding to a fifth energy: a) that is less than the energy difference between the first energy state and third energy state; b) that is different to the energy difference between the first and second energy states of the further atomic system; c) that is different to the energy difference between the second and third energy states of the further atomic system. The second photonic memory may also be configured to use the fifth electromagnetic radiation to cause at least a part of the photon field be emitted from the atomic system.

This concatenation of photon storage may be used for applications such as, but not limited to, Linear optical quantum computing (LOQC) or Boson sampling. However, unlike previous attempts to realise a series of optically linked photon memories in LOQC, the present application utilises a ladder-type atomic system to store photon fields. The term 'ladder' is intended to mean a three or more electronic energy level structure in an atomic system whereby the electrons can transition between the ground and top-most energy levels, via the one or more intermediate energy levels, by absorbing photons whose energies add up to the energy difference between the ground and top-most energy levels. Previous attempts to concatenate photonic memory elements include using Raman based systems described by G. T. Campbell et al. in "Configurable Unitary Transformations and Linear Logic Gates Using Quantum Memories" Physical Review Letters, 8$^{th}$ Aug. 2014, 113, 063601. These suffer from noise and low operating speeds due to the relative closeness of the frequencies of the stored photon fields and the radiations used to read in and read out the photons. It is preferable to use pulses to deliver the second and third EM radiation. The closer the frequencies are, the narrower the bandwidths need to be of the first and second EM radiations so that these radiations can be wavelength discriminated or separated (e.g. by a spectral filter) in a further photonic circuit. The narrower the bandwidth of the signals, the longer the EM pulses need to be, hence the slower the rate of delivery of pulses to the system and the wider the time bins that each pulse occupies.

Furthermore, ladder type photonic memories may be simpler to construct and can operate with lower noise and higher efficiency, even above room temperature. This is due to easier and more efficient spectral filtering, and the absence of four-wave mixing; a noise phenomenon present in Raman based systems.

With a plurality of memories in a chain, it is possible to wait until all the memories are "charged up" with photons, before implementing a unitary transformation (interference) between all the photons, by retrieving using a suitable combination of control pulses. In other words where a plurality of memories are used that are photonically linked, two or more of the plurality of memories may be used to store at least a portion of one or more signal photon fields, either from the same or a different photon. At a particular time after the said field portions are stored, control pulses are introduced to each of the two or more memories to read out at least a portion of the signal photon field held in that memory. Any one or more of these control pulses may be incident simultaneously in time with other control pulses or they may sequenced in time such that at least two, preferably all, of the emitted photon field portions overlap in time temporally and/or spatially.

Furthermore, as described above, the photonic memories used allow for wavelength conversion of the stored photons. If the EM pulse used to 'read-out' the stored photon is different to the EM pulse used to 'read in' the photon, the photon may be emitted with a different wavelength, hence photon energy, to what it was read-in with. For boson sampling applications of the apparatus, previous boson sampling disclosures only discuss controlling static splitting ratios of light going into the loop by virtue of the beam splitter used, whereas the atomic system used in the present application provides for more dynamic control over the photons used.

The apparatus may also comprise a system for inputting the first EM radiation into the atomic assembly. This first radiation may be known as 'signal' radiation and the corresponding one or more sources it is generated by may be referred to as signal sources. The system may comprise a single photon generating source. This single photon generating source may be used for the signal source. Such a source may include, for example, a quantum dot source, or a source using nonlinear photonic processes such as spontaneous parametric down conversion (SPDC) or spontaneous four wave mixing (SFWM). Other single photon sources are also usable. The source may input a train of single photons into the atomic system. The single photons may be deterministically provided by the source or be in a superposition of at least one photon and vacuum. The train of photons may be all the same frequency or different frequencies. The time separation between successive photons may be substantially the same or different. The system may also include other photonic and electronic components or equipment associated with inputting the photons of the first EM radiation, for example, but not limited to: electronic control apparatus for controlling the photon emission from the source, optical light paths and waveguides such as optical fibres and integrated waveguides.

The apparatus may also comprise a system for inputting the second EM radiation into the atomic assembly. The second, third, fourth or further EM radiation used to read in or read out the photons from the first EM radiation may be termed 'control' radiation. Such control EM radiation may be generated by one or more EM sources. Such a source may include, for example, a laser. The light output from the laser may be input into a nonlinear medium to wavelength convert the laser light before being input into the atomic system. The system may also include other photonic and electronic components or equipment associated with inputting the photons of the control EM radiation, for example, but not limited to: electronic control apparatus for controlling the photon emission from the source; optical light paths and waveguides such as optical fibres and integrated waveguides; optical attenuators and amplifiers for controlling the signal intensity; polarisation controllers and optical modulators. Control systems such as electronic control systems may be used to control the photon flux and temporal pulse width of the read-in or read-out pulses. Such control systems are communicatively linked to the components controlling the photon flux and temporal pulse width such as optical amplifiers and optical modulators. Such control systems can also be used to control the wavelength and polarisation of the input EM radiation. Similar systems may be used for inputting EM radiation for reading in and reading out the first EM radiation in any of the photonic memories. Additionally, or alternatively some systems may be used to generate read out and/or read in pulses for one or a plurality of photonic memories. For example, the system for inputting the second EM radiation may be the same as the system for inputting the third EM radiation. The system for inputting the fourth EM radiation in the second photonic memory may be the same as the system for inputting the fifth EM radiation in the second photonic memory.

The first EM radiation source (or 'signal' source) of may be arranged to encode one or more of: the polarisation information of the electromagnetic radiation of the signal source, the frequency information of the of the electromagnetic radiation of the signal source, the direction information of the electromagnetic radiation of the signal source and the temporal information of the electromagnetic radiation of the signal source, in one or more modes of electromagnetic radiation that the signal source generates to be incident upon the atomic system.

The signal source of electromagnetic radiation and/or the one or more control sources of electromagnetic radiation are each arranged to generate a plurality of pulses of electromagnetic radiation to be incident upon the atomic ensemble.

It is further noted that the shape of the control pulses may determine the shape of the temporal mode that is stored and retrieved. For example a read-out control pulse with a peak intensity in the centre of a time bin but with a sharp leading edge and a long trailing edge gives rise to increased possibility that signal photon being emitted from the memory is emitted towards the back end of the time bin where the majority of the control pulse energy resides. Furthermore, the chirp or frequency spread of the control pulse across the control pulse may also affect the time-period when a signal photon is emitted or stored. If the control pulse contains a spread of frequencies with the frequency needed for the two-photon transition at the leading edge of the pulse in the time bin, then the signal photon may be more likely stored/emitted from the memory at the front edge of this time bin.

Qubits represented by the signal photon fields of the apparatus can therefore be encoded in an arbitrary temporal mode basis (not just "time bin modes", but also potentially "frequency modes", or any other basis). The apparatus may therefore provide for the possibility of using different frequencies of control fields or moving photons between time bins (and generating superpositions of time bins).

In another example a control pulse time bin may be occupied by a plurality of control pulses (referred to as sub control pulses) spaced out in time in the bin. Each control pulse is therefore in a sub-bin of the overall time bin for that control pulse set. The overall time bin may be synchronised and have substantially the same time-width as the signal photon time bin (if the sub bin control pulses are used to store). When reading signal photon fields out of the memory, the sub bins can be used to change the probability of where within the overall bin time width the signal photons are emitted. Each sub control pulse may vary from other sub control pulses in other sub bins by any one or more of: intensity, frequency, polarisation, chirp, shape. For example, if each sub control pulse has the same intensity but different central wavelength then the signal photon possibly emitted in each sub bin also changes in frequency in order to satisfy the multiphoton atomic transition.

The apparatus, of any example described herein, may use photonic detectors to detect the EM radiation, for example at least the first EM radiation and optionally other EM radiation such as the second or third EM radiation associated with the control pulses used to read in and read out photons to/from memory. The detectors may be any type of detector but are preferably either photon number resolving detectors or photon detectors that operate in Geiger mode. A Geiger-mode photon detector may be able to resolve between a) no photons and b) one or more photons; but not be able to resolve between one and two photons. These detectors may be referred to as bi-state detectors or bucket detectors. An example of such a detector is a single photon avalanche photodiode typically formed from silicon or indium gallium arsenide. Another example of a bucket detector is a superconducting nanowire.

Photon number resolving detectors resolve different numbers of photons, for example being able to resolve between no photons, one photon, two photons, three photons etc. Examples of photon number resolving detectors include but are not limited to: a transition edge sensor made of molybdenum gold or molybdenum copper bilayers.

The atomic system may comprise a single type of neutral atoms or ions or a plurality of different types of neutral atoms and/or ions. The atomic system may be an atomic ensemble comprising a plurality of atoms, such as a gas of atoms, or ions, such as a rare earth ion locked in a host medium. Such an atomic system uses energy levels associated with electrons in inner or outer shells of atoms, ions, or crystal defects. Examples of atomic ensembles are presented elsewhere herein and include vapours containing Rubidium. Other energy levels of atomic system may be used including Rydberg — type systems. Additionally, or alternatively the atomic system may comprise a single neutral atom or ion, for example single $^{87}$Rb atoms in a magneto-optical-trap (MOT).

The first and second electromagnetic radiation may be different in one or more photonic properties including having different polarisations and/or having different frequencies (hence wavelengths). The first, second and third energy levels may be associated with energy levels of electrons. The atomic system may be accommodated within a housing that is optically accessible to the different EM radiation that is input into it. For example, the atomic system may comprise an atomic ensemble comprising rubidium atoms. The atomic ensemble may be accommodated within a hollow core section of an optical fibre.

Further Examples of Apparatus

As described above the further storage of the field portion emitted by the atomic ensemble may be achieved by feeding back the said field portion into the photonic memory from which it was emitted. This feedback may be a reflection back in the opposite direction from the direction it was emitted from or it may be fed back into the photonic memory in a different direction, for example along a similar or same input optical path as the photon was input into the photonic memory when it first was stored.

The apparatus may be configured such that photonic memory receives the first electromagnetic radiation along a first input path. This first input path may be the same as or different to the input path that the second radiation is input into the photonic memory. For example, the second radiation may be input into the photonic memory such that the first and second electromagnetic radiation propagate through the photonic memory substantially opposite each other. This may be advantageous where doppler cancellation is required as discussed elsewhere herein. The output path that the photon, of the first electromagnetic radiation, is emitted from may be directed to spatially coincide with the input path. In other words, the paths merge by the output path feeding backing to join the input path before it enters the photonic memory.

The apparatus comprises an optical switch that receives the first and second electromagnetic radiation from spatially different paths and outputs the radiation along a common path towards the photonic memory. This optical switch may be an electro-optic switch, a Pockels cell, a MEMS or any other type of photonic switch. The optical switch may also be a passive optical combiner, for example a wavelength division multiplexer.

The output path that the photon gets emitted from the photonic memory may also be input into a further photonic switch that controllably routes the photon along one of two photonic paths. In this configuration the optical switch receiving the feedback photon and the first electromagnetic radiation is denoted the first photonic switch, whilst the photonic switch receiving the emitted photon output from the photonic memory is referred to as the second photonic switch. The first path output from the second photonic switch is directed towards the photonic memory via the abovementioned first photonic switch. The second path is output away from the feedback loop and away from the photonic memory.

FIG. 5 shows an example of an apparatus 1102 that may be used for boson sampling. Two separate photonic switches 1116, 1118 are used to switch in and out photons 1110a-n from a loop 1120. The loop 1120 is a photonic path that guides photons to propagate from the second switch 1118 to the first switch 1116. The path 1120 represents a portion of a feedback loop extending from one photon input/output of the photonic memory 1104 to another input/output of the photonic memory 1104. The path 1120 may contain one or more controllable photonic elements such as a phase shifter. The loop is typically formed from optical fibre, however other light guiding apparatus may be used such as bulk optics directing photons in free space or integrated optic components and, in general waveguides. Photons 1110a-n represent a train of photons (also referred to as signal photons) generated by one or more photons sources, preferably a single source for outputting photons, preferably a source that can output a single photon in a single time bin.

These signal photons are input along an optical fibre 1103 and enter the first switch 1116 where they are passed through the first switch 1116 and into a further optical fibre that input the photons into the memory 1104. Control pulses (not shown) of second, third or further EM radiation are input into the second switch 1118 via fibre 1105. The second switch 1118 routes the control pulses through to the memory 1104 such that the control pulses are incident upon the memory in a counter propagating direction to that of the signal photons, the benefit of which is discussed elsewhere herein. The control pulses are synchronised to arrive at the memory at the same time as the signal photon pulses, with a different control pulse corresponding to a different signal photon. The control pulses are used to store/emit field portions of signal photons in/from the memory. After exiting the memory, 1104, the control pulses are routed by the switch 1116 into fibre 1103. However signal photons exiting the memory may be routed by the switch 1118 into the feedback loop 1120 and around to switch 1116 where they are switch back into the feedback path to enter the memory again. Therefore, the signal time bins, representing where portions of a signal photon could be, may be routed continuously around the feedback loop by the switches 1116, 1118. With suitable control pulses, different portions of a signal photon may be stored/emitted each time one of its time bins is incident upon the memory. The different field portions of a signal photon or other indistinguishable signal photons in the train may therefore interfere as they are stored or emitted from the memory.

For example, if at any time a field portion of an incoming photon is attempted to be stored in a memory already containing a field portion of a different indistinguishable photon, the two field portions will interfere.

FIG. 6a gives an example of such two-photon interference. The features of FIG. 6a are similar to that of FIG. 5 with like numerals representing like features. In FIG. 6a, two signal photons 1110a/b are input into the apparatus and are switched into the memory 1103. The first photon 1110a is shown in a solid line whilst the second photon 1110b is shown in a dashed line. Two corresponding control pulses (not shown) are sent into the memory to respectively interact with the arrival of the signal photons 1110a/b into the memory 1104. The control pulses are both set to 25% likelihood to store a new incoming photon/emit an existing stored photon. FIG. 6b shows, in a classical perspective the photon field portions stored and emitted after both control pulses have exited the memory 1104. The pulse shapes above the memory 1104 indicating what is stored in the memory 1104.

FIG. 7 shows the same signal photon field portions transmitted or emitted by the memory 1104, (from a classical optics perspective) having been round the loop 1120 and routed by the switch 1116 to be incident upon the memory 1104 again. The transmitted/emitted signal photon field portions being in two adjacent time bins. This time another set of control pulses are input into the apparatus and subsequently switched out. This further control pulse set comprises three control pulses in a train (not shown). The first control pulse of this second set coincides with the arrival of the first time bin coming back around the loop 1120, the second with the arrival of the second time bin, the third control pulse arriving at the memory after the exit of the second time bin from the memory 1104. The first control pulse has a photon flux large enough to deterministically output whatever is stored in the memory 1104; hence also deterministically stores incoming signal photon field portions. The second control pulse has a photon flux that outputs signal photons from the time bin with a 75% probability; hence also stores incoming signal photon field portions with 75% probability. The third control pulse is similar to the first control pulse of the second set and deterministically outputs whatever is stored in the memory 1104. All of the signal photons are then output by the switch 1118 along fibre 1105 to a detector.

Figure 8:
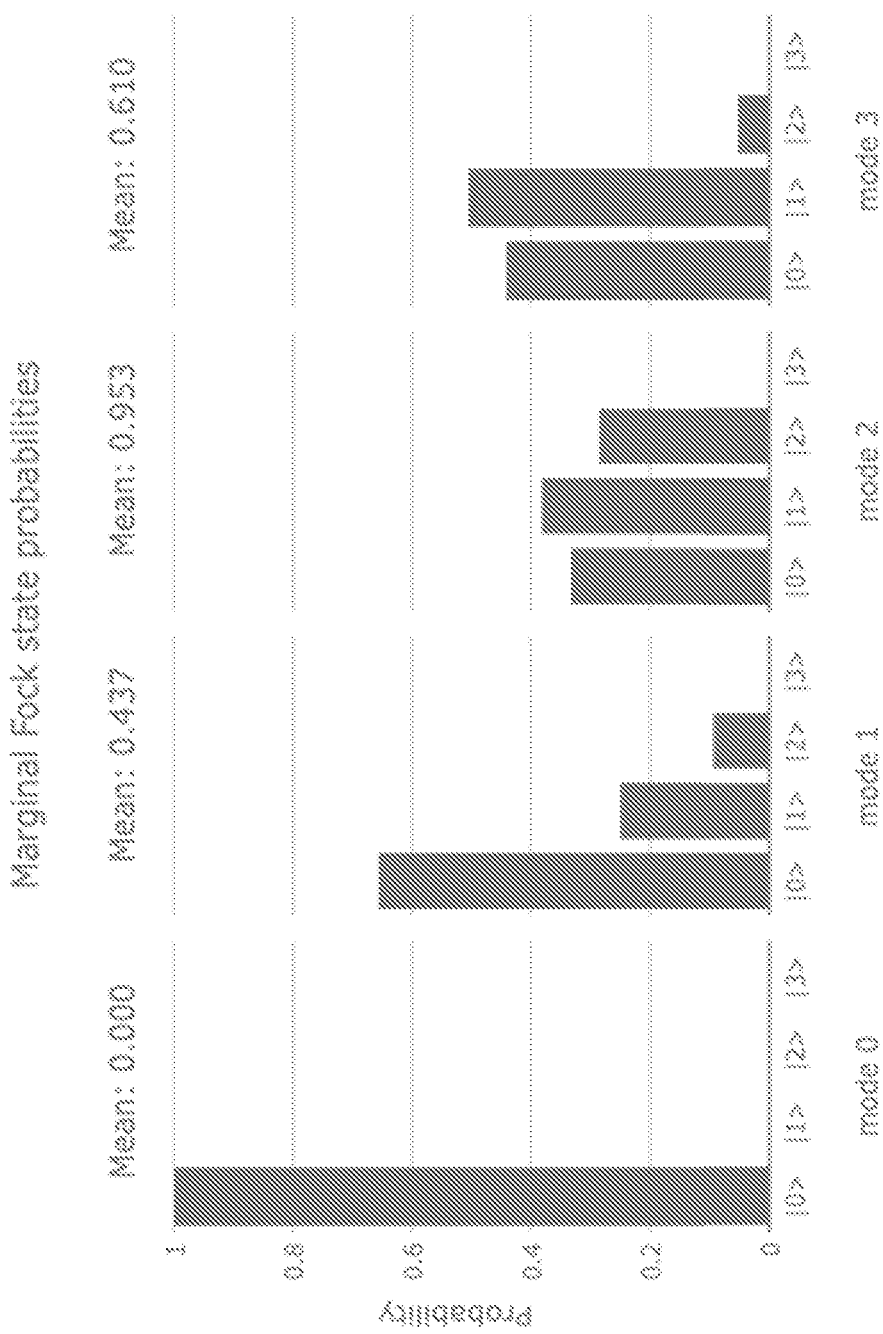
FIG. 8 shows resultant marginal Fock state probabilities of the apparatus of FIGS. 6a-6b and 7.

FIG. 8 shows the resultant marginal Fock state probabilities, or photon number distributions, of the four different modes of the signal photons taking into account photon interference and photon bunching effects. The number distribution represents the probability of finding 'n' photons in that mode. The mean values show the likelihood of detecting a photon in that mode. The number distribution is up to 2, as that is the number of signal photons sent into the apparatus 1102. The sum of the means equals 2, hence the total number of signal photons entering the apparatus. Modes 1,2,3 are the three consecutive time bins emitted from the memory 1104 corresponding to the three control pulses of the second set of control pulses input into the memory 1104. Mode 1 being the first time bin to exit the apparatus via fibre 1105. Mode 0 is what is left in the memory, which in this case is nothing, i.e. vacuum, because the third control pulse in the second set deterministically output all stored photon field portions.

FIGS. 9-13d describe further examples of using one or more photonic memories (also referred to as quantum memories). The examples shown in these figures may be adapted according to other features from any other example described herein including but not limited to any of the following: photonics paths types (for example optical fibre, free space, integrated waveguides); photonics source, signal photon properties, time bin rates, memory types and configurations of use, control pulse sources and operational characteristics and associated components such as optical amplifiers, attenuators; photon detectors; photonic switches; electronics and control systems.

Figure 9:
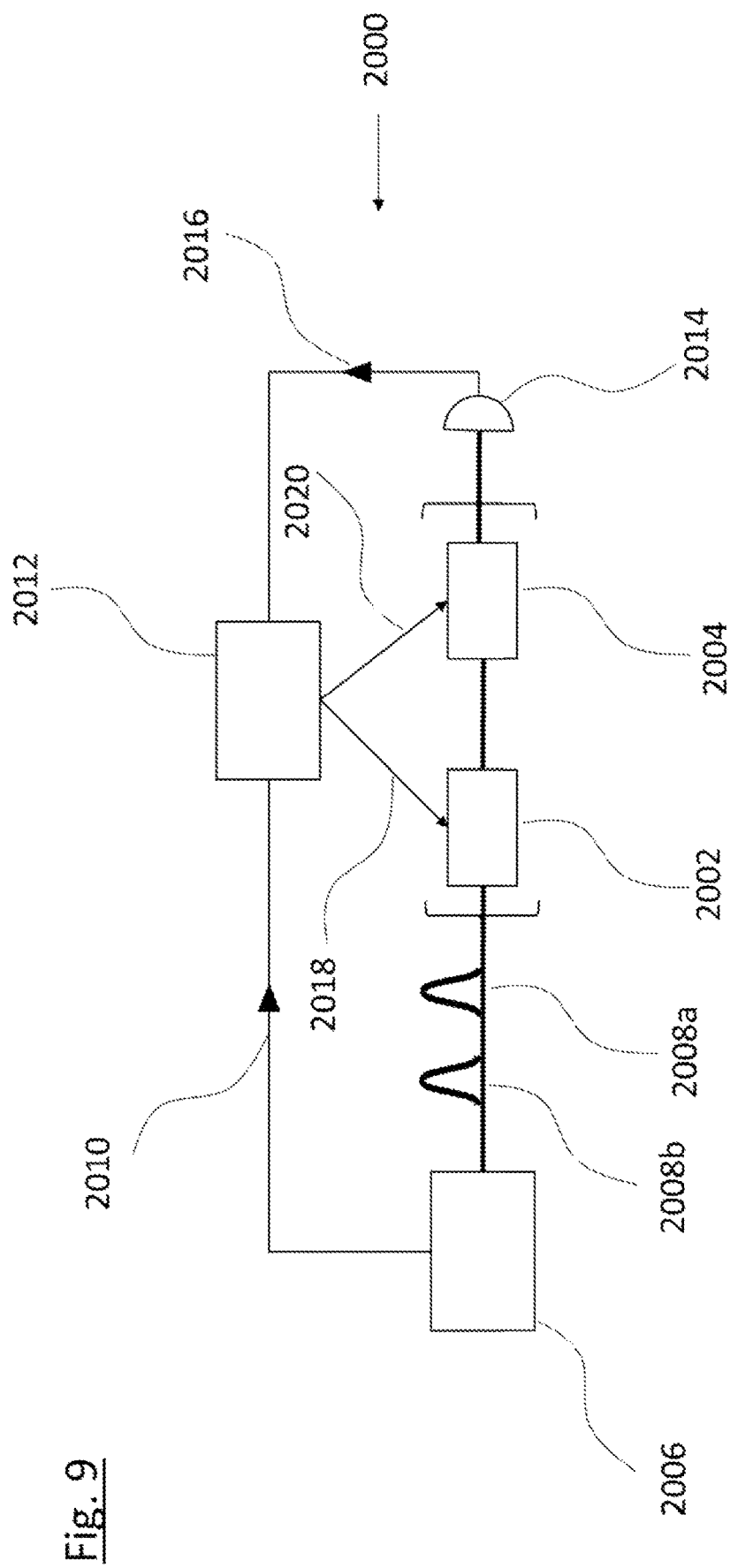
FIG. 9 shows a schematic example of an apparatus using a chain of two or more photonic memories.

FIG. 9 shows a schematic example of an apparatus 2000 using a chain of two or more photonic memories (although only two are shown in the FIG. 2002, 2004 such as, but not limited to, the memories described with respect to FIG. 3.

A pulsed single photon source 2006 (such as a quantum dot or multiplexed heralded single photon source) produces single photons in a train of pulses 2008a/b or time bins. Time bins are separated by a characteristic time tau that is determined by laser or electronics driving the generation of the single photons in the source 2006. The electrical clock signal from the source is fed 2010 to the control electronics 2012 to provide a timing reference to performing operations on the time bins via control pulses fed through to the memories by photonic paths 2018, 2020. The control electronics here could be based on e.g. an FPGA.

The train of M time-bins 2008a/b are sent into a chain of quantum memories 2002, 2004 of length N. Each memory 2002, 2004 acts as a beam splitter on the time-bins 2008a/b allowing the apparatus 2000 to perform entangling operations between time-bins 2008a/b, by first reading the time-bin 2008a into the memory 2002 using a first strong control pulse (not shown). When a further time-bin (for example 2008b) that we wish to interfere with the stored bin 2008a enters the memory 2002 a second strong control pulse is sent into the memory 2002 to carry out the beam splitter unitary. The first control pulse that is used to store the time-bin has a photon flux that optimises the storage of the time-bin 2008*a* with the highest efficiency. The second control pulse that mediates the beam-splitter interaction has a variable photon flux. The effective beam-splitter reflection and transmission coefficients of the memory 2002 are determined by the magnitude of control field photon flux.

During the computation, time-bins 2008*a*, 2008*b* may be recalled from any memory 2002, 2004 arbitrarily and routed through the system to a detector 2014 at the end of the chain. This may be a single photon detector that allows measurements such as the number of photons present in the time-bin. The detection result can be fed back 2016 to the control electronics 2012, where depending on the result the beam-splitter unitaries may be updated by changing any of the photon flux, timing or any other control pulse photonic property.

Figure 10:
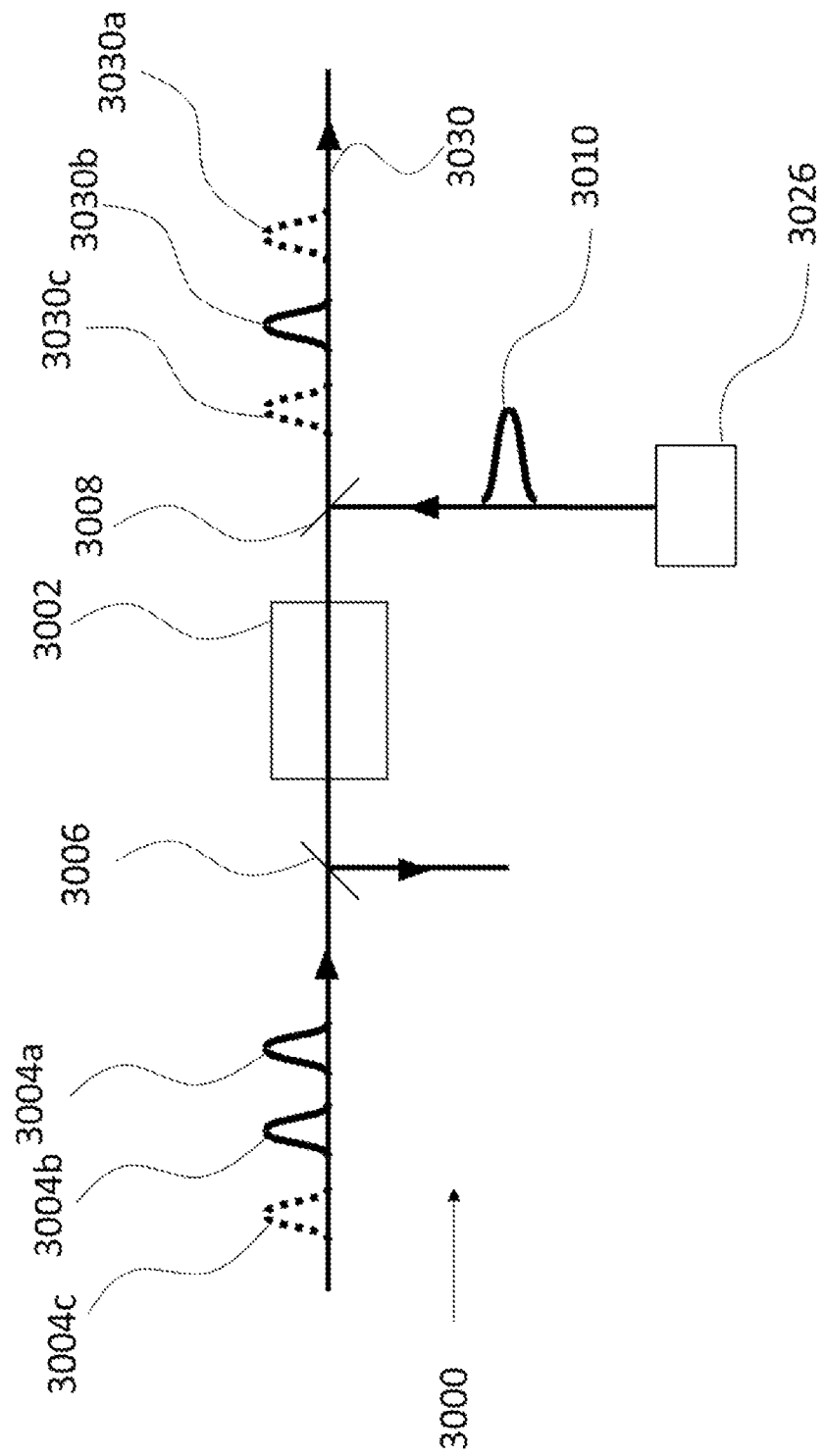
FIG. 10 shows an example implementation of a quantum memory.

FIG. 10 shows an example implementation 3000 of a quantum memory. The quantum memory may be the memory shown in FIG. 14*b* and described elsewhere herein. The quantum memory may alternatively be another type of quantum memory described elsewhere herein. One quantum memory 3002 is shown, however there may also be a photonically linked chain of one or more quantum memories. The apparatus of FIG. 10 is set up using bulk optics, in particular the mirrors 3006, 3008, SHG (see below) and other equipment used to generate the control pulses, however portions may be implemented using optical fibre or integrated optics.

A stream of time-bins 3004*a/b/c* (each with a probability of hosting a single photon) enters the memory 3002 from one direction, via passing through a dichroic mirror 3006. A further dichroic mirror 3008 is disposed the other side of the memory 3002 such that photons may pass through the memory 3002 from one mirror 3006 to the other 3008. The strong control field 3010 enters counter-propagating through the memory 3002, via reflection off the dichroic mirror 3008. The counter propagating nature of the control field allows phase matching conditions to be achieved, for example if the memory comprises a vapour cell. The first and second dichroic mirrors 3006, 3008 are transmissive to signal source wavelengths but reflective to control pulse wavelengths.

The control field 3010 is generated using a source 3026 of pulsed electromagnetic radiation at the correct optical frequency and wavelength, which for a rubidium vapour cell used in this example is 776 nm. This source may be a mode-locked titanium sapphire laser or a CW External Cavity Diode Laser followed by a Tapered Amplifier and an intensity modulator for pulse carving, for example a Pockel's cell and/or acousto-optic modulator. Alternatively, this could be another source of pulsed electromagnetic radiation at the correct optical frequency and wavelength. The timing of the pulse generation is optimised so that the final control field pulse 3010 is overlapped temporally with the target time bin 3004*a-c* in the memory 3002 and is ultimately selected by the control electronics (not shown).

When the control field 3010 is temporally overlapped in the memory 3002 with the time-bin 3004*a-c* we wish to store; the signal photons in the time-bin are read-in and stored.

To perform a unitary on the time-bins 3004*a-c* of interest, which can be selected arbitrarily, a second control pulse generated from the laser and equipment shown in FIG. 10, (not shown) is generated, following the first control pulse, at a time such that it will temporally overlap with a further time-bin of interest in the memory 3002. The control electronics sets the photon flux of the second control pulse to perform the effective beam splitter unitary required, for example as requested by the user or as determined from feedback from a detector. This couples the further time-bin with the time-bin previously stored in memory 3002 with a strength according to the photon flux of the second control pulse (and hence emulating the reflection and transmission of a beam splitter). The output mode, resulting from the interaction of the second control pulse with the memory 3002 exits the memory 3002 and is directed down the chain to either be interacted with further stored time bins in subsequent memories or directed 3030 to a detector for analysis. FIG. 10 shows the output modes 3030*a-c* of the apparatus 3000 that pass through the dichroic mirror 3008 and onto photonic detection equipment such as a detector. Modes 3030*a* and 3030*c* are shown in dotted lines because they are time bins in which the signal photon was stored.

Another effective output mode, following the interaction of the second control pulse in the memory 3002, is stored in the memory 3002 for further processing or analysis at a later time (i.e. the other mode is the stored portion of the signal photon field). It should be understood that more than one photon may be stored in the memory following the interaction, for example in a Hong-Ou-Mandel Interference-like process.

Figure 11:
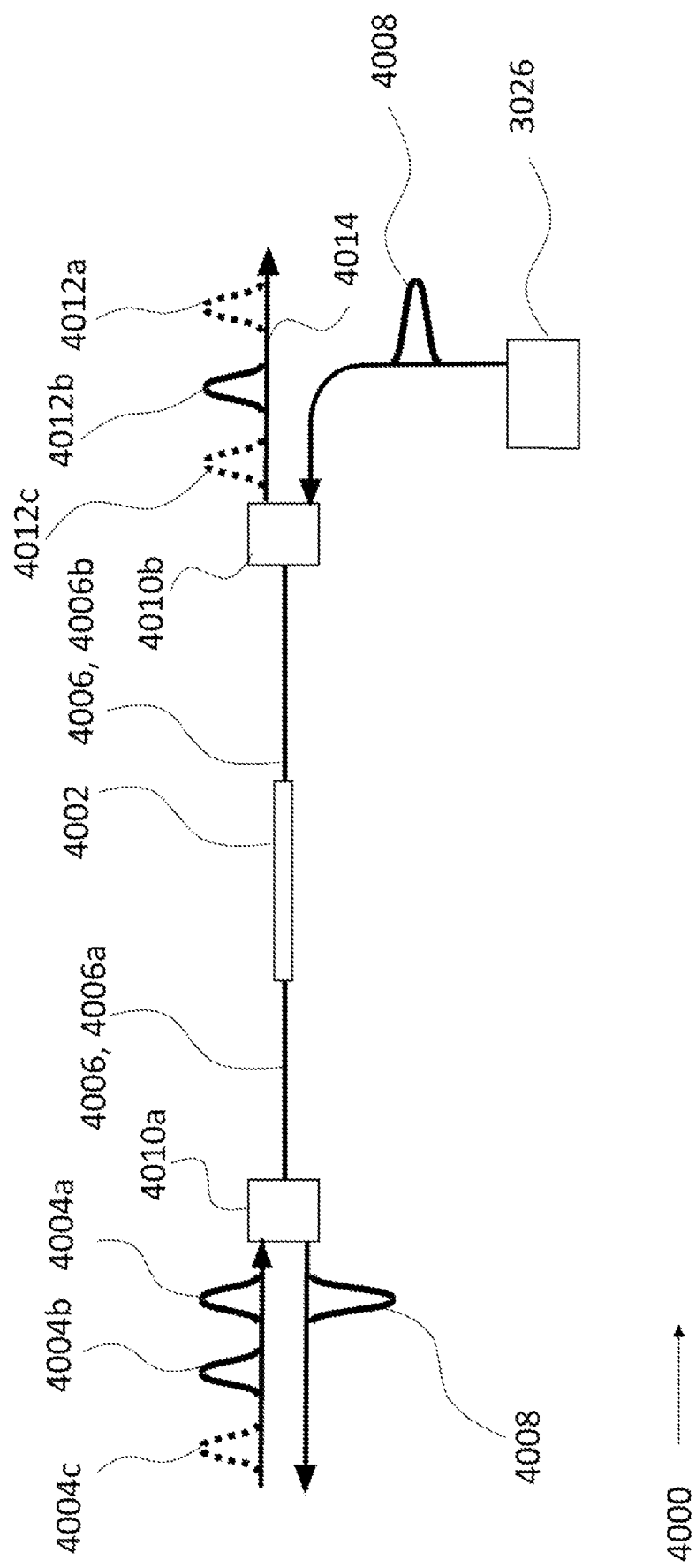
FIG. 11 shows a fibre-optic based example of the apparatus.

Apparatus may also be assembled not just in free-space, but also in fibre optics as exemplified in the schematic example shown in FIG. 11.

In FIG. 11, apparatus 4000 has a memory 4002 formed by a filled hollow-core optical fibre vapour cell connected, either via splicing or any other method, to conventional optical fibres 4006 at either end similar to the example shown in FIG. 14*b*. FIG. 11 shows a single memory, however there may be a chain of two or more memories photonically linked and optionally physically coupled together by optical fibres 4006. In FIG. 11 a first single mode optical fibre 4006*a* is used to input signal photon time bins 4004*a-c* into the memory 4002; whilst a second single mode optical fibre 4006*b* is used to input control pulses into the memory 4002.

The signal photon time-bin train 4004*a,b,c* and control fields 4008 are input into the memory 4002 by first passing through a wavelength combiner 4010*a/b*. In this example the wavelength of the signal photons and the wavelength of the control photons used to read in or read out the signal photons from the memory are different.

The wavelength combiners 4010*a/b* may comprise any of bulk dichroic mirrors and fibre couplers, wavelength division multiplexers, unbalanced MZIs, however for purposes of this discussion we shall refer to the wavelength combiners 4010*a/b* as WDM's.

The signal photon time bins 4004*a-c* are input, via an optical fibre, into a first WDM 4010*a*. WDM 4010*a* has at least two inputs, via two optical fibres and at least one output via an optical fibre 4006*a*. The signal photon time bins 4004*a-c* are input into the WDM 4010*a* via one of the inputs whilst the other input is used as an output fibre for directing control pulses output of the WDM 4010*a* that arrived into the WDM 4010*a* via fibre 4006*a*. The output fibre 4006*a* is used to carry signal photon time bins into memory 4002 and carry control pulses into WDM 4010*a*.

The control field 4008 is generated in a similar manner as described for FIG. 10 using a source of pulsed electromagnetic radiation 3026. The output of the control field generation equipment is input into a second WDM 4010*b*. The second WDM 4010*b* has at least two inputs, via optical fibre, and at least one output, via an optical fibre 4006*b*. A first input is used to carry control pulses 4008 into the WDM 4010*b* wherein the WDM 4010*b* outputs them onto fibre

400b to be directed to memory 4002 such that the control pulses 4008 and signal photon time bins 4004a-c propagate in opposite directions to each other in the memory, which has phase matching advantages as discussed elsewhere herein. The other input to the WDM 4010b is used as an output for signal pulse time bins that have exited the memory 4002 and have been input into the WDM 4010b via fibre 4006b.

In any of the examples shown herein, including FIGS. 10 and 11, the components used to generate the control pulses may comprise at least one photon source or a photon source system having a plurality of components for outputting the desired control pulses. A photon source for outputting the control pulses may be a photon source, such as a laser, at the desired control pulse wavelength for the memory atomic transitions that is directly modulated to generate pulses and the desired output intensity. In this example of a single control pulse source, the electrical control signals driving and controlling the source are used to determine the pulse width, pulse output frequency and pulse output intensity. As discussed elsewhere, the electrical signals may be input via an electrical controller. Other operations of such an electrical controller are discussed elsewhere herein. Preferably the control pulse source is a source system comprising a source for generating photons and one or more other photonic elements that are able to do at least one of: control the output intensity of the control pulses input into the memory via attenuating and/or amplifying the photons output from the source; modulate the output of the source to create pulses of the desired width and pulse output (and optionally pulse frequency distribution and pulse shape) and change the wavelength of the control pulse (for example by a non-linear optical process such as SHG or FWM). Having different functionalities in different photonically linked components typically provides better quality and control of the control pulse outs. Any of the above components of the control pulse source system may be controlled by an electronic controller supplying electrical control signals to the said components. The photon source itself may be configured to perform any of the above further functions, for example the source may output pulses.

Coming back to FIG. 11, the control electronics (not shown) produce a series of electronic signals to control the pulsed laser 3026 for each memory 4002, including the photon flux of the control pulses 4008, which in turn controls the unitary coefficients applied to the signal time bins 4004a-c via interacting with the memory 4002. Each control pulse affecting the storage and emission of signal photon time bins with the memory and their photon-interference with each other. This shall be referred to as 'operations'. As a series of operations progresses, measurements on parts of the optical state of the signal photon time bins may be performed using a detector (not shown) that receives signal photon time bins via photonic path 4014 which in this example is an optical fibre receiving photon time bins from WDM 4010b. The detector therefore receives signal photon time bins at the end of the chain of one or more memories 4002. The electrical detector signals can be fed back to the control electronics. Depending on the results of these detector measurements the unitaries applied to each of the memories (via the timing, photon flux, pulse shape etc of the control pulses 4008) may be updated to interact different time-bins. This determination may be achieved by an algorithm or software program that is being run on an electronic processor associated with the control electronics and optionally stored in a memory electronically accessible to the processor.

Preferably the detector needs to be sensitive to single photon level light such as a single photon avalanche photodiode (SPAD), superconducting nanowire single photon detector (SNSPD), transition edge sensor (TES) or photomultiplier tube (PMT). These detectors may be used by other examples herein. The detector preferably also needs the ability to discriminate between photon number states. TES based detectors are able to do this natively, however the other remaining detectors may not, although SNSPDs have been shown to have some photon number resolving capability. This quality can be introduced to these binary detectors by using multiplexed detection and splitting the input onto many detectors either in the spatial or temporal domain. There may be a detection system comprising a plurality of 'D' detectors and an optical network of e.g. beam-splitters with one input and D outputs. Signal photons are passively routed to each of the D detectors with a probability determined by the splitting ratio and loss of the optical network between the single input and the D outputs, such that each detector D on average can detect at most one photon. Thus the total detecting function may comprise of up to 'D' detector elements can then discriminate between 1 to D photons with some probability determined by the splitting ratios of the photonic network of the memories and beam-splitters, and the efficiency of each individual detector element. Through a process of detector tomography or calibration, the statistics of the clicks from the detectors can be inverted to give the photon number states impinging on the input of the global detector.

Figure 12:
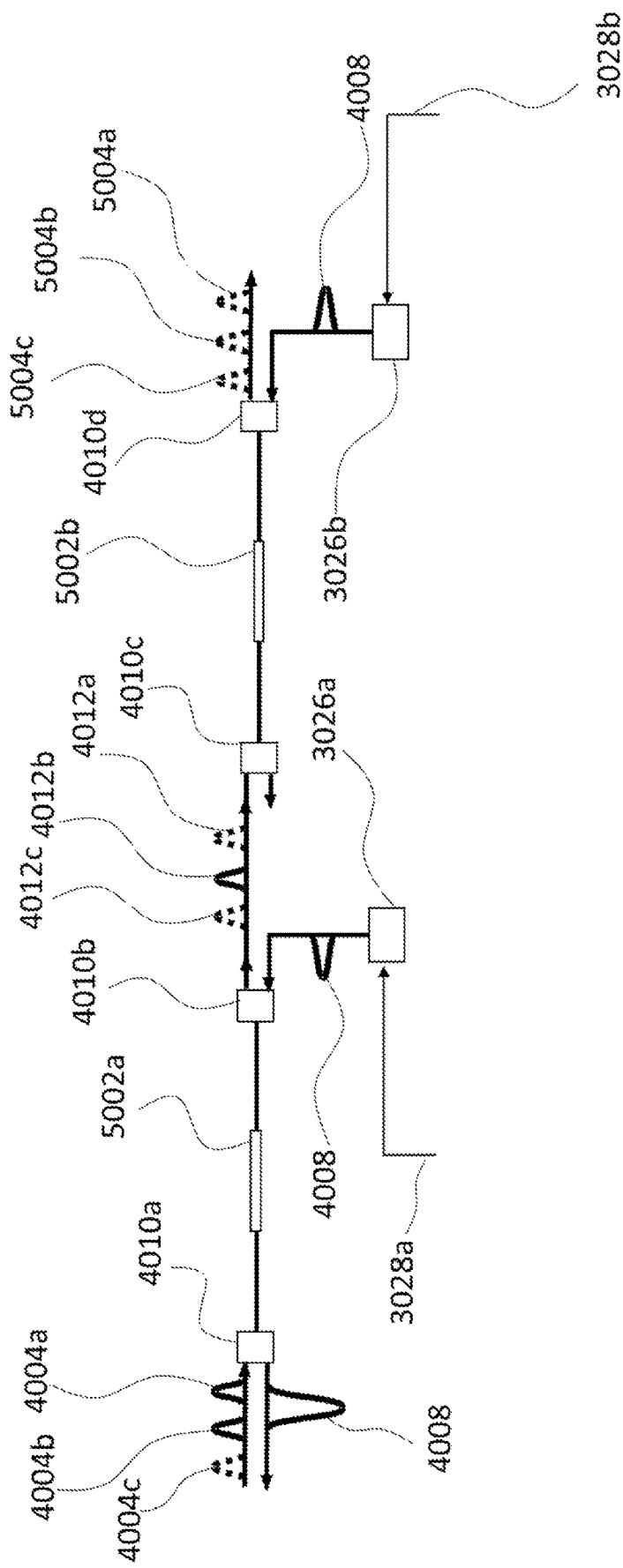
FIG. 12 shows a further fibre-optic based example of the apparatus.

FIG. 12 shows an apparatus 5000 similar to that of FIG. 11 wherein like numerals represent like components. Descriptions of components and configurations for FIG. 11 may equally apply for the example of FIG. 12. Memory 5002a is photonically linked to WDM 4010a and receives signal photon time bins 4004a-c in a similar way to FIG. 11. Memory 5002a is photonically linked to WDM 4010b and receives control pulses 4008 via this WDM; and output signal photon time bins 4012a-c similar to FIG. 11.

In this apparatus 5000, the output signal photon bins 4012a-c are input via an optical fibre to a third WDM 4010c that is substantially similar to WDM 4010a in that a further optical channel into/out of the WDM is for wavelength demultiplexing control pulse receives from second memory 5002b into a separate physical channel to the input signal photon bins received from WDM 4010b. WDM 4010c outputs the received photon bins 4012a-c into an optical fibre that is photonically linked and physically coupled to second memory 5002b. Memory 5002b receives its own set of control pulses separate, and independently controlled, to the ones sent into memory 5002a to determine the unitaries. In turn, memory 5002b outputs signal photon time bins 5004a-c that it inputs, via an optical fibre into fourth WDM 4010d which is substantially similar to second WDM 4010b. WDM 4010d receives control pulses 4008 and outputs them into the fibre feeding memory 5002b and output the signal photon time bins 5004a-c along an output path, different to the path for instructing control pulse 4008, towards a detector or detector system.

The control pulses fed into WDM 4010b and 4010d are derived from photon sources 3026a/b, controlled by corresponding electrical signals 3028a/b.

FIG. 12 therefore concatenates two memories allowing signal photon time bins to be operated on (by control pulses from a first control pulse source sub system) in the first memory 5002a and then output into the second memory 5002b where they can be operated on again (by control pulses from a second control pulse source sub system).

Further memories and associated WDMs and control source sub systems may be used to concatenate further memories into a photonically linked series.

FIGS. 13a-d how a potential series of operations is used to manipulate the signal photon time bins for an apparatus shown in FIG. 10, 11 or 12 although the principle may apply to other apparatus described herein. Firstly, a train of signal photon time bins 3050a-d are generated by a signal photon source. Four time-bins are shown with a signal photon in each bin; however, each bin may be occupied by up to 'n' photons where 'n' may be the same or different for each bin.

The system is initialised by storing these time bins in the chain of memories 3052a-d via corresponding control pulses 3054a-d. In this example the first memory 3052a, that the signal photon time bin train encounters is used to store the first time bin 3050a that is input into it. The remaining memories 3052b-d store each successive photon time bin such that each next memory in the chain stores the first un-stored time bin that it receives, however other configurations are also possible. FIGS. 13a and 13b show the time bins 3050a-d entering the memory system and being in a stored state, respectively.

FIGS. 13c and 13d show an example of the memories 3052a-d and the field portions of the signal photons from the bins when further control pulses 3056, 3058, 3060, 3062 are input into the memories to control the storage/emission of signal photon fields to/from the memories 3052a-d. If, for example we wish to firstly interact bins 3050b and 3050d and then, after, interact the result with bin 3050a we perform the following set of operations. These figures are schematic representations and are not showing the full equipment required, for example photonic elements such as WDMs for allowing any one control pulses to only be input into a single memory in the chain.

First, we recall bin 3050b from its memory 3052b by inputting control pulse 3056 and send it towards the fourth memory 3052d in the memory chain in which bin 3030d is stored. We then input control pulse 3058 into memory 3052d with a control pulse photon flux that implements the desired coupling between the input modes and overlaps the recalled and emitted second bin 3050b inside the fourth memory 3052d. A portion of the signal photon bins 3050b and 3050d remain stored within bin 3064 in memory 3052d due to the control pulse photon flux not deterministically storing or emitting photons from the memory 3052d (hence the memory 3052d here acts as a beam splitter). As a result of the photon flux of the control pulse 3058, one of the output modes corresponds to emission of photons into an output time-bin 3066 which propagates out from memory 3052d and through any further memories in the chain. The second output mode 3064 corresponds to storage of the state in the memory 3052d.

Next, we want to interact the first stored time-bin 3050a with the remaining mode 3064 stored in the fourth memory 3052d in the chain. Control pulse 3060 is input into memory 3052a to recall (hence emit) the stored state from memory 3052a. As the recalled bin 3050a propagates through the fourth memory 3052d, we temporally overlap this output with a further control pulse 3062 (sent into memory 3052d) with a photon flux to carry out the operation we require. In FIG. 13d this further control pulse 3062 is set to non-deterministically store/release signal photon portions from the memory 3052d, hence the resulting stored mode 3068 and output mode 3070 have probabilities of having portions of the signal photons from the first third and fourth initial time bins 3050a,c,d. These photon portions with interfere using Hong-Ou-Mandel type photon interference.

A measurement, by a detector, may be made on the first output time-bin 3066 (from the memory chain) and used to adjust the control pulse photon flux of further control pulses 3060, 3062 to control further interactions in the memories (for example in this case 3052d). This feed-forward control helps calibrate and control the memory system, and implement operations required for universal quantum computation.

There is also presented an apparatus for storing one or more photons. The apparatus comprises one or more photonic elements. The one or more photonic elements comprising at least one photonic element forming part of a photonic cavity. This may be a reflecting element using the physical principles of reflection (for example a mirror or an optical fibre grating) or an element receiving EM radiation and directing that radiation along one or more optical paths (for example a Mach-Zehnder interferometer or polarising beam-splitter). Furthermore, at least one photonic element is for receiving first electromagnetic radiation from outside the photonic cavity and transmitting the said received first electromagnetic radiation into the photonic cavity. Furthermore, at least one photonic element is for receiving second electromagnetic radiation from outside the photonic cavity and transmitting the said received second electromagnetic radiation into the photonic cavity. The photonic element forming the cavity may be the same as the photonic element for receiving the first EM radiation and/or the same as the photonic element for receiving the second EM radiation. Alternatively, these photonic elements may be different. An example where the same photonic element performs all three functions is the example shown in FIG. 14a wherein the Mach-Zehnder interferometer (MZI) switch 6008 notionally 'reflects' light back into the loop when considering the MZI as equivalent to a beam splitter. The photonic cavity may exist between two of the photonic elements, for example two separate and spatially separated mirrors. Alternatively, the photonic cavity may be a loop-like cavity as in FIG. 14a.

The apparatus may further comprise a photonic memory disposed in the photonic cavity. The photonic memory comprising an atomic system. The atomic system may be similar to other atomic systems described elsewhere herein and any of the features described for such photon memories may be used with this apparatus. Other atomic systems and photonic memories may also be used such as Raman based systems. The atomic system of this apparatus is configured to A) receive at least one photon of first electromagnetic radiation, the photon having a field; B) receive second electromagnetic radiation; C) store at least a portion of the field of the photon in the atomic system via an atomic transition using the photon and the received second electromagnetic radiation; D) emit the stored portion of the photon upon receiving third electromagnetic radiation. The apparatus is further configured to output the emitted portion of the field into the cavity.

Some of the optional features of the apparatus are presented in the above summary section. Any one or more of the optional features in the summary section may be combined with any of the examples presented underneath for this apparatus.

An example of the above apparatus is exemplified in FIG. 14a. FIG. 14a shows a loop cavity configuration wherein the photonic memory 6018 is located inside the loop cavity. The loop in this example is formed from one or more lengths of optical fibre 6016, preferably single mode optical fibre. The loop is shown schematically in FIG. 14a, with a spool of optical fibre 6016a elongating the loop length. The loop fibre is photonically coupled to a switch 6008, which in this example is a Mach-Zehnder interferometer (MZI), however other switches may be used. The MZI may be embodied in any material or configuration, for example in lengths of optical fibre, free space and bulk set-ups or in integrated optics. Preferably in this example the MZI is an integrated optic MZI. The integrated optic MZI may be formed from any suitable material waveguide platform including polymer, silica, silicon nitride, silicon or other semiconductor materials, lithium niobate. In this example the MZI has a phase shifter 6014 in at least one of the interferometer arms that can be controllably used to induce a 7C phase change to light propagating along the arm, which in turn acts to switch the light from one output port to another. Preferably in this example the MZI is a balanced MZI with substantially equal arms lengths between the two MZI couplers 6010 and 6012, however unbalanced MZI designs are also possible. The phase shifter may be able to apply a phase change along the arm of the MZI that controllably switches photons in adjacent time bins in and out of the loop. Preferably, the MZI 6008 has a switching speed equal to or above the inverse of the time bin separation time tau, preferable above 100 MHz. In another implementation, the MZI has a switching speed above the roundtrip time of the optical loop, preferably above 10 kHz.

The MZI has four input/output optical waveguides or channels 6009a-d, these are also referred to as ports. Typically, these are referred to as a set of two input channels and a set of two corresponding output channels. Whether the channels are inputting or outputting EM radiation is dependent upon where the EM radiation is being input into. The couplers 6010 and 6012 may be, for example directional couplers or MMI couplers.

In general operation the MZI may be set to direct light from within the loop to continue propagating in the loop, i.e. light entering port 6009b may be directed through to port 6009d. This may be done in a number of ways including any the following: A) actively switching light into the desired port by activating the phase shifter to impart a phase shift; this can be achieved using a balanced or unbalanced MZI; B) use an unbalanced MZI that is set to transmit light between the desired input/output ports 6009b and 6009d. This may be achieved, for example, by having the phase imbalance between the arms being π.

Photons are therefore allowed to propagate around the loop several times and then dynamically switched out by activating or turning off the phase shifter 6014 so that light entering port 6009d gets switched out of the loop by being directed to port 6009a. Correspondingly photons can be switched into the loop by using the phase shifter 6014. In order to switch photons in or out of the loop the signals sent to the phase shifter that cause it to change the phase of photons propagating through it, may be synchronised with the arrival of the desired photons into the phase shifter 6014. If the switch 6008 is alternatively set to, by default, couple photons into and out of the loop, then the phase shifter may again be synchronised to couple the photons into the loop that are incident upon the switch from the loop.

The spool of optical fibre 6016a may be any length of optical fibre, or otherwise any delay line, that is fixed or variable in delay length. This delay length may be required to allow a set of photons to be switched in or out of the loop.

An advantage of the configuration shown in FIG. 14a is that only one switch 6008 is required to switch in and out the photons into the loop compared to other boson sampling schemes using multiple loops such as that described in the Motes paper discussed above.

FIG. 14b shows an example of the photonic memory 6018 used in this example, although other memories may be used. Photonic memories used in this example and other examples herein may also be referred to as quantum memories. This example of photonic memory uses a vapour cell of rubidium atoms in a hollow core of an optical fibre that is coupled on each end by optical fibres of the loop 6016. This memory example is further described elsewhere herein.

Also connected to ports of the switch are photonic paths, preferably optical fibres, that photonically link the switch to photonic elements 6006, 6020 used to couple light in from signal or control sources and separate light output from the loop from going to such sources. In this example these photonic elements 6006,6020 are wavelength multiplexers/demultiplexers ('WDM's) which may be, for example unbalanced MZI's or other wavelength splitting components such as optical thin film filters.

Light from a signal source (not shown) is input into path 6002. The paths in this example photonically connecting different components are optical paths formed from optical fibres, however other photonic paths may be used as described elsewhere herein. The light propagating along the optical fibre and is input into WDM 6006 to which the fibre 6002 is coupled to. The WDM 6006 also has another input/output port that connects to a further fibre 6004. This further fibre is connected to a beam dump (not shown) intended to absorb EM radiation from control pulses being output from the switch 6008 via port 6009a. The inputs 6002, 6004 to the WDM are wavelength multiplexed into a common output fibre that feeds signal EM radiation into a port 6009a of the switch 6008. In this example the switch is a balanced MZI wherein the two arm lengths between couplers 6010 and 6012 have a nominal equal optical path length when the phase shifter is not activated (i.e. no signal has been sent to the phase shifter to change the phase of light travelling down its respective arm). Single photons in successive bins in an output train from the signal source are therefore directed from the signal source through the WDM 6006 to the switch and are directed into the loop via switch output 6009d. From there they travel through the spool 6016a and into the memory 6018 to be stored in the memory or transmitted without being stored dependent upon a control pulse also being incident upon the memory for each photon time bin as previously discussed. Signal photons not stored in the memory continue round fibre loop 6016 and enter switch port 6009b. The MZI 6008 is nominally set to output the signal photons entering port 6009b out through port 6009c. Port 6009c is photonically linked to a second photonic element 6020 which may be substantially similar to photonic element 6006. In this example element 6020 is a WDM that can receive signal photons from the switch and output them along output photonic path 6022 towards a detector (not shown). The detector may be a single photon resolving detector or a bucket detector as described elsewhere herein. The WDM 6020 has two output paths it can route photons out of that it receives from the switch 6008. The other path is path 6024. In this example paths 6022 and 6024 are optical fibres. The path 6024 in this example is photonically linked to the one or more control sources used to input control EM radiation pulses into the switch 6008.

For any of the signal or control sources of EM radiation, it is assumed that any other optical or electrical component required to generate the photonic pulses may also be used such as modulators, synchronisation electronics, optical amplifiers and other components exemplified elsewhere herein.

The control pulses (i.e. the second EM radiation or third of further EM radiation) from the one or more control sources are input into the WDM 6020 from fibre 6024. The pulses are separated into time bins, preferably a time bin for each signal photon time bin. The intensity of each control pulse in each bin is preferably controllable. The control pulses may be varied in intensity between no photons or one or more photons and may vary in levels of non-zero intensity.

The controllability may be determined by a controller as described elsewhere herein (not shown). In some examples, the detector for detecting the signal photons may output a detection signal that may be used by the controller to determine (and correspondingly output electrical signals to the appropriate components to effect) any of: A) the timing of signal photons entering the loop 6016 or memory 6018 (hence timing of generation of signal photons); B) the generation, or not, of a signal photon in a bin or the probability of a signal photon being generated in a bin. Similarly, the same one or more detection signals maybe used to determine the timing and photon flux of control pulses from any of the control sources. In addition, or in the alternative a further photonic detector (not shown) may be photonically linked to fibre 6004 such that the further detector may detect pulses of photons output from the switch 6008 via port 6009*a*. This further detector may operate in a similar way as described above for the signal photon detector.

Control pulses entering the WDM 6020 are output by the WDM 6020 to be input into port 6009*c* of the switch 6008. As the MZI switch 6008 is balanced, the control pulses get routed through the MZI and are output via port 6009*b* to propagate around the fibre loop 6016 and into the memory 6018 in the opposite direction to which the signal photons enter the memory 6018. The arrival, in the memory 6018, of each control pulse time bin is preferably synchronised with the arrival, in the memory, of a signal photon time bin that the control pulse is targeted to affect. Control pulses may also be used to read out signal photons from the memory, as such these control pulses do not need to be synchronised with the arrival of a signal photon into the memory, although they may do.

After the control pulse enters the memory and performs any storage/emission of signal photons, the remaining portion of the control pulse propagates around the loop 6016, through the fibre spool 6016*a* and into switch port 6009*d*. The balanced MZI then nominally outputs the pulse from port 6009*a* such that the control pulse enters the WDM 6006 and gets output from the WDM 6006 into fibre path 6004.

As discussed above signal or control pulses that enter the switch from either ports 6009*a* or 6009*c*, get output from the switch 6008 via the corresponding cross-port 6009*d* or 6009*b* respectively. Those pulses travel round the loop 6016, through the memory 6018 and enter back into the switch via the other of the ports 6009*b/d* from which they entered. The switch 6008 then outputs the pulses via the cross ports 6009*a/c* such that signal pulses enter the switch 6008 from port 6009*a* and exit the switch 6008 from port 6009*c* whilst control pulses enter the switch 6008 from port 6009*c* and exit the switch from 6009*a*.

Any of the control pulse or signal pulse time bins may be switched by the switch 6008 to be output be the respective through port. The through port for port 6009*b* is port 6009*d* and vice versa. The through port for port 6009*a* is port 6009*c* and vice versa. The apparatus 6000 may switch out any control pulse or signal pulse. The apparatus 6000 does this by applying an appropriate signal, such an electrical signal, to the phase shifter 6014 that is synchronised with the desired photonic pulse. The phase shifter temporarily unbalances the MZI arms and switches the output port that the pulse exits from: 6009*c* to 6009*d* or vice versa; or 6009*a* to 6009*b* or vice versa. Thus, in an unbalanced state, the switch MZI directs pulses entering the switch 6008 from the loop via port 6009*d* to 6009*b* and vice versa. The switch may therefore be used to cause photon pulses to continually propagate around the loop multiple times. The switch 6008 can also be used to direct pulses entering the switch 6008 from ports 6009*a* or 6009*c* to output from the other of the switch ports 6009*a* or 6009*c* and hence not enter the loop 6016. The switch may also be operated to switch in/out a plurality of adjacent time bins by setting the MZI to be unbalanced by the duration of the time bins, rather than gating each one individually.

In an example of operation, the signal time bins are a train of adjacent time bins of length 'n'. These are generated to enter the switch via port 6009*a* before the time bins of the second radiation control pulses are input into port 6009*c*. As the signal train leaves the switch 6008 via port 6009*d* it passes through spool 6016*a*. The spool 6016*a* acts to offset the temporal position of the memory 6018 in the loop such that the photonic paths between the memory 6018 and the two switch ports 6009*b/d* (linking the switch 6008 to the loop 6016) are unbalanced, preferably by an optical path length equivalent to or longer than temporal time of the 'n' successive bins, preferably by an optical path length equivalent to or longer than the inverse of the switching speed of the MZI.

Thus, the signal bins transmitted through the memory 6018 and entering switch 6008 via port 6009*b* do so before the second EM radiation control pulses exit the memory and enter the switch 6008 via port 6009*d*. The time delay between the signal bins entering the switch and the control bins entering the switch 6008 is therefore at least the temporal time of the 'n' successive bins. During the time period of the first signal bin to the last signal bin, in the train, entering the switch 6008, the phase shifter may be set to switch the pulses back into the loop via port 6009*d*. Alternatively these bins may be selectively output from the loop. However, after the last signal bin exits the switch, the first of the control bins enters the switch from the loop 6016 via port 6009*d*. The MZI phase shifter 6014 can then revert to nominal operation and not apply any phase shift, thus allowing all of the control bins to exit the loop and get output from port 6009*a*.

The ability to selectively switch pulses in or out of the loop allows signal pulses to continually traverse the loop and get stored or emitted by the memory with corresponding control pulses, hence allowing for photon interference in the memory. However, the control pulses may be switched out of the loop (if required) upon each round trip of the loop 6016 so that they do not enter the loop again. This allows newly generated control pulses to enter the loop from port 6009*c* and control the storage or emission of the signal photons passing round the loop the second time. This scheme can be used for each successive round trip of the signal photons in the loop. Alternatively, any one or more of the signal pulse bins may be switched out of the loop at any pass through the switch 6008, for example being output for detection. Additionally, or alternatively, any one or more of the control bins may be switched back into the loop for re-use.

FIGS. 15*a-c* and FIG. 16 show further examples of such as apparatus using multiple reflectors as the one or more photonic elements. As such there is also presented an apparatus for storing one or more photons. The apparatus comprises a plurality of reflectors for reflecting electromagnetic radiation, at least two of the plurality of reflectors forming a photonic cavity. The plurality of reflectors comprises at least a first reflector and a second reflector. The first reflector can receive first electromagnetic radiation from outside the photonic cavity and transmit the said received first electromagnetic radiation into the photonic cavity. The second reflector can receive second electromagnetic radiation from outside the photonic cavity and transmit the said received second electromagnetic radiation into the photonic cavity. In an alternative the above functions of the first and second reflector may be performed by the same reflector.

The apparatus also comprises a photonic memory disposed in the photonic cavity. The photonic memory comprises an atomic system. The atomic system may be similar to other atomic systems described elsewhere herein and any of the features described for such photon memories may be used with this apparatus. Other atomic systems and photonic memories may also be used such as Raman based systems. In principle the atomic memory is configured to: A) receive a photon of first electromagnetic radiation, the photon having a field; B) receive second electromagnetic radiation; C) store at least a portion of the field of the photon in the atomic system via an electronic transition using the photon and the received second electromagnetic radiation; D) emit the stored portion of the photon upon receiving third electromagnetic radiation. The apparatus is further configured to direct the photon into the photonic memory after being reflected into the photonic cavity by at least one of the plurality of reflectors. The apparatus is further configured to output the emitted portion of the field into the cavity.

Some of the optional features of the apparatus are presented in the above summary section. Any one or more of the optional features in the summary section may be combined with any of the examples presented underneath for this apparatus.

The apparatus may therefore introduce both first and second sources of EM radiation into the cavity, by the same or via different reflectors. These reflectors may be mirrors, dichroic mirrors, fibre-Bragg gratings, polarisation splitters or other reflectors such as those described elsewhere herein. Any one or more of the reflectors may be wavelength selective and/or polarisation selective.

The photon from the first EM radiation can enter the cavity, propagate in the cavity, reflect off one of these reflectors and enter the memory. The apparatus can also output the emitted photon or stored field portion of the photon from the cavity. The apparatus therefore allows the photon to propagate in the cavity, possibly entering the memory a plurality of times (being stored or not). However, the apparatus also allows the photon to be switched out of the cavity. This may be accomplished in a variety of ways highlighted by the two non-limiting examples given below. This allows for control of how many times the first photon (from the first EM source) is stored and emitted before being released, which in turn has advantages in quantum computation particularly when the memory is operated to put photons in a quantum superposition of being both stored and transmitted by the memory and/or a quantum superposition of being continually stored and emitted by the memory. In such a quantum superposition a portion of the photon field resides in the memory and one or more portions of the photon field exists outside of the memory, for example within the cavity. Such configurations may be used in Boson sampling and LOQC as described elsewhere herein. As described in other examples, multiple first photons may be used with the memory particularly for boson sampling and LOQC applications. Each of these first photons, often forming an input train, may be held within the cavity or emitted.

In the following two examples shown in FIGS. 15*a-c* and 16, the apparatus transforms the photon between at least two states. One state allows the photon to pass into and out of the photonic cavity, the other allows the photon to stay within the cavity and reflect off the cavity end-reflectors. By being able to control when the photon stays in the cavity and thus enters the memory (for storage or transmission) and when it is output by the cavity, the user of the system can control the number of times a photon is stored in the memory, hence giving rise to the advantages that lend to LOQC and Boson sampling described above. Transforming the first photon's polarisation or wavelength are not the only ways to switch the first photons into and out of the cavity. Other example may include technologies involving mechanical path switching such as a fast MEMS or Acousto-Optic Modulator.

It is noted that the cavity may also have reflectors in between the end reflectors and that the term 'reflector' is intended to mean an element that has the function of reflecting EM radiation but that can also transmit or even absorb EM radiation. It is also noted that the reflector may also not reflect 100% of EM radiation it is designed to reflect, but may reflect substantially all of the field.

In the two examples below the photon is transformed from a first state to a second state. The first state and second state of the photon are different in at least one of polarisation or wavelength, possibly both. It is noted that the photon may have other states, such as having a total of three wavelength states, however for purposes of discussion we are using a two-state system to describe the examples. It is also understood that combinations of both examples may be possible.

FIG. 15*a* shows an example set-up of an apparatus where wavelength is used to differentiate between the states of the photon. In summary, this example uses a ladder-based atomic system where an initial 'first photon' of a first wavelength is input into the cavity via a reflector that is wavelength selective and transmissive to the first wavelength. Additionally a control pulse of EM radiation is also input into the cavity so that they simultaneously propagate in the memory and allow the photon of the first wavelength and a photon from the control pulse to be stored in an off-resonance transition between a first and third atomic state of the atomic system.

In FIG. 15*a*, the control pulse of the second EM radiation is input through a different reflector to the reflector passing the first photon of the first EM radiation, however in principle both EM radiation can be input from the same reflector. The wavelengths of the first and second EM radiation are set such that their combined energies allow for an electron to transition from a first to the third energy state. This is shown in FIG. 15*c* which is similar to FIG. 3 wherein like references represent like features. In FIG. 15*c* Fs is the frequency (hence energy) of the 'signal' photon (i.e. the first photon of the first EM radiation having the first wavelength). The reference Fc is the frequency (hence energy) of the control pulse photon at the second wavelength. The two-photon transition uses off resonance atomic energy level 108*d*.

In this example the plurality of reflectors comprises two identically designed optical fibre Bragg gratings 7006, 7014 that act as wavelength selective edge-pass filters and define the photonic cavity. These components may also be referred to as 'Bragg filters', 'filters', 'Bragg reflectors' or 'FBGs'. Other wavelength filters, such as dichroic mirrors or line filters, may be used. The filters do not need to be identical, but for purposes of this example they are. FIG. 15b shows a graphical representation showing the optical frequency response of these Bragg filters having optical transmission 'T' as the vertical axis and optical frequency 'F' along the horizontal axis. The frequency response 7026 starts on the left from a low magnitude of transmission, for example any of: less than 5%, less than 1%, less than 0.1%. In turn this means that the Bragg filter has high reflectivity at these frequencies. The frequency response then transitions upwardly in an edge portion 7028 to a maximum transmission level where transmission is, for example, greater than 95%, greater than 99%, greater than 99.9%. The frequencies Fc and Fs are situated on the high transmission portions of the FBG frequency response and thus these photons can pass from outside the cavity through the filters 7006, 7014 and into the cavity.

The cavity in this example is formed from optical fibre that connects different components, however the set-up may be embodied in other photonic platforms such as free space or in integrated optic form.

Once a photon, or a portion of the photon field, from the first EM radiation is stored, a further control pulse of third EM radiation may be input into the cavity by any of the Bragg gratings 7006, 7014. In this example both control pulses of the second and third EM radiation are input via Bragg grating 7014, however this is not always necessary. The third EM radiation has a different wavelength to the second EM radiation and thus a different frequency Fc'. When the control pulse of third EM radiation is incident upon the memory 7008 and enters it, it can 'read' the memory and stimulate the emission of the first photon. Because the frequency Fc' of the third EM radiation is different to the frequency of the second EM radiation Fc, the first photon is emitted from the memory 7008 with a different wavelength (hence frequency Fs') than the first wavelength and frequency Fs. Again, this is shown in the energy level diagram 15c wherein the off-resonance atomic energy level 108' is used instead of the previous level 108. In this example, the off-resonance energy level 108' is below the intermediate (second) energy level 108b of the atomic system whilst the off-resonance energy level 108 is above the intermediate (second) energy level 108b of the atomic system, however a reversed level configuration is possible. In this example the off-resonance levels 108 and 108' are set at a frequency difference of A each side of the second energy level 108b, however the energy differences may be different.

FIG. 15b shows that the control pulse frequency Fc' of the third EM radiation is the highest of all four of the photon frequencies (Fc, Fs, Fc', Fs') in the write/read process. Correspondingly, because the emission process uses the same total energy as the two-photon transition to store the first photon, the emitted photon Fs' has the lowest of the energies. This frequency Fs' is situated on the low transmission part of the frequency response 7026 of the Bragg filters 7006, 7014. Thus, once the first photon is emitted with this 'new' wavelength (i.e. in the second state) it is reflected by both of the Bragg filters 7006, 7014 and is confined to the photonic cavity.

Whilst in the cavity, the first photon may be stored and emitted one or more times by appropriate introduction of a control pulse at either the wavelength of the second or third EM radiation (or another wavelength). It is noted that because the control pulses are situated on the high transmission portions of the frequency response 7026, they pass into and output the cavity in a single pass through the cavity. This is also the case for the portion of the field of the first photon not stored by the memory.

When the apparatus 7000 is outputting the first photon from the cavity, it does so by storing the first photon and inputting a control signal to emit the photon from the memory that will transform the first photon frequency Fs' into another frequency (for example back into Fs) that will be transmitted by one or both of the Bragg filters 7006, 7014 such that the first photon is coupled out of the cavity. The first photon frequency used to couple the first photon out of the cavity may the same frequency that the first photon has when initially input into the cavity or a different one.

The apparatus 7000 of FIG. 15a will now be described. The apparatus 7000 may be adapted in numerous ways including from any other teaching herein, including but not limited to any details pertaining to the photonic memory, its operation, the EM radiation that is used to operate the memory, the EM sources that output the EM radiation and any control electronics and control systems used to operate the apparatus and any of its components.

A single photon source 7002 is used to generate single photon states in determinable time bins and output them into an optical fibre circuit 7010. The optical fibre circuit comprises one or more lengths of optical fibre guiding the EM radiation from the source 7002 and other EM sources. The optical fibre is preferably single mode optical fibre, but multimode optical fibre may also be used. Any one or more parts of the apparatus 7000 may be formed from integrated optic components and may be integrated into a monolithic or hybrid integrated platform. For example, the source 7004 and one or more of the other components in the apparatus 7000 may be photonically linked via one or more integrated optic waveguides.

The first source 7002 may be directly coupled to the optical fibre by, for example, one or more lenses. The optical source may be a system comprising a plurality of separate or integrated components for generating the single photon states. The single photon source 7002 may comprise one or more photonic components that may be electrically controllable and may utilise non-linear optical phenomena to generate the single photons, for example Spontaneous Parametric Down Conversion (SPDC) or Spontaneous Four Wave Mixing (SFWM), or be a near-deterministic single photon source based on quantum dots or single atoms or ions, or crystal defects. The single photon source may have a probability of generating a photon in a particular time bin between 1%-100%. The photon states may be output in a train of photons which may be periodic or non-periodic with respect to time intervals.

The photon source 7002 may output zero, one or more single photon states of the 'first photon' (see explanation of the apparatus above) that is then input into a wavelength multiplexer/demultiplexer. For the purposes of this discussion, this component 7004 and the further similar component 7016 may both be referred to as a 'WDM'. The WDM may receive EM radiation of different wavelengths on spatially separate channels (for example two separate optical fibres or other waveguides) and spatially multiplex them onto the same output channel. Conversely, when EM radiation is propagated in an opposite direction the WDM 7004 spatially demultiplexes the wavelengths into spatially separate output channels. A typical technology used for this may be an unbalanced Mach-Zehnder interferometer in integrated optic form, however bulk-optic/free-space and optical fibre configurations are also usable. In this example the WDM 7004 accepts EM radiation from: A) the fibre connecting it to the source 7002; and B) a further optical fibre channel 7024 that is connected to a beam dump (not shown).

The output from the WDM is input via an optical fibre into a section of optical fibre having an FBG 7006. The FBG 7006 has the edge filter frequency response as schematically represented in FIG. 15*b* as described above. The output of the FBG 7006 is input via an optical fibre into an input/output of the photonic memory 7008.

The photonic memory in this example is any of the atomic system described herein, preferably in this example an atomic ensemble of Rubidium atoms in a vapour phase encapsulated in a hollow core section of an optical fibre. The photonic memory 7008 has a further input/output separate to the input/output proximal to the FBG 7006. The further input/output of the memory 7008 is connected to a length of optical fibre 7012 (for example a spool of optical fibre) that, in turn connects to the second FBG 7014 which is substantially similar to the FBG 7006. The FBG 7014 is also connected to a further WDM 7016. The WDM 7016 may receive EM radiation from the FBG 7014 and output EM radiation on two spatially separate output channels, which in this example is: A) an optical fibre further connected to a detector or detector system 7018 and, B) an output optical fibre 7020 connected to a second set of one or more optical sources for outputting the EM control pulses into the FBG 7014.

It is noted that the term 'connected' above is intended to be photonically connected or linked such that photons pass from one component to another. The components may also be physically connected, for example physical attachment or mating of one component to another either directly or via an optical guiding medium such as an integrated optic waveguide or optical fibre.

The second optical source 7022 may comprise one or more EM sources capable of outputting control pulses. The photon flux density or intensity of the control pulses may be controllable, for example by an electronic controller that may be user operated or automatic or semi-automatic. The controller may receive electrical signals from other components of the apparatus or elsewhere. For example, the detector 7018 may output electrical signals directly to the electronic controller or another electronic controller such that the one or more electronic controllers electrically connected to the second source/s and detector may receive and transmit electrical signals to such components. The controller may determine the output intensity or photon flux of an EM control pulse based at least upon an electronic signal output from the detector 7018. Additionally, or alternatively the timing of the output of the control pulse may be determined in the same manner. In determining the control pulse timing or intensity, the electrical signal from the detector may be compared, by an electronic processor, to one or more parameters stored in a memory that is accessible by the processor.

The EM control pulses output by the one or more sources 7022 may be output at rates of 1 MHz or above, preferably 10 MHz or above, preferably 100 MHz or above, preferably 1 GHz or above. The EM control pulses may be output with any bandwidth, including but not limited to any one or more of the following ranges and values: 10 MHz or above, preferably 100 MHz or above, preferably 1-5 GHz.

The EM control pulse sources may be a set of two or more separate sources, of differing wavelengths, that are optically linked onto the same input fibre 7020 that inputs the EM control pulses into the WDM 7016. Additionally, or alternatively, the sources 7022 may comprise one or more wavelength tuneable sources. The sources 7022 may also include other components in a 'source system' to input the required EM control pulses into the WDM 7016. These may be, for example, optical amplifiers, optical attenuators, optical modulators, optical fibres, polarisation controllers, optical isolators, second harmonic generation components, optical filters. Examples of optical source systems that may be used are presented elsewhere herein. The wavelength range of operation of both the first source 7002 and second source/s 7022 may be any range of operation that corresponds to the operation of the atomic system of the memory 7008, including but not limited to 775 nm-796 nm, or 1520 nm-1570 nm. For example: the first source 7002 may be 1552 nm whilst the second source 7022 is 776 nm; or, the first source 7002 may be 1560 nm whilst the seconds source 7022 may be 780 nm. These example wavelengths may be variable by +/−a few GHz. Other wavelength ranges presented herein may also be used.

When the EM control pulses are generated and output from the source 7022 and input into the photonic cavity, defined between FBG 7014 and FBG 7006, they are synchronised to be incident and propagate within the memory with the arrival and propagation of the first photon/s within the memory. In other words, the propagation of the first photon in the memory and at least one of the control pulses is simultaneous. Further control pulses are synchronised for: A) the first photon or another photon from the photon source 7002, when emitted from the memory, reflecting off an FBG and being input back into the memory 7008; B) the first photon or another photon from the photon source 7002, being required to be emitted from the memory 7008. Thus, in others words the control pulses are synchronised with the storage or emission of the 'first photons' into/from the memory 7008.

In FIG. 15*a*, only one direction of EM control pulse propagation is shown from the EM control pulses sources 7022 to FBG 7014, through memory 7008, and out of the cavity via FBG 7006, through WDM and output onto fibre 7024. The control pulses can equally be configured to be input at other positions in the apparatus 7000. For example, one or more of the WDM's 7016 or 7004 may be disposed inside the cavity. Additionally, or alternatively, control pulses may be input into the cavity from fibre 7024 as an alternative to being input via fibre 7020, or in addition. If the EM control pulses are being propagated into the cavity in the same direction as the photons from the first source 7002, then any phase matching conditions may need to be addressed depending on the atomic system used. An advantage of counter propagation is that Doppler-based effects are minimised in the atomic system, particularly in Rubidium vapour-type memories. However other memories such as Raman or GEM memories in warm vapour, or single atom/ion/defect memories or solid-state memories or cold-atom memories may not require a counter-propagating set-up. If two sets of EM control pulses are used then, one being input from fibre 7022, one being input via fibre 7024, then isolators may be required by each source 7022 to prevent light being input into the control pulse sources.

The detector or detector system 7018 may be a single photon detector or a photonic 'bucket' detector and may be any other detector as described herein.

Figure 16:
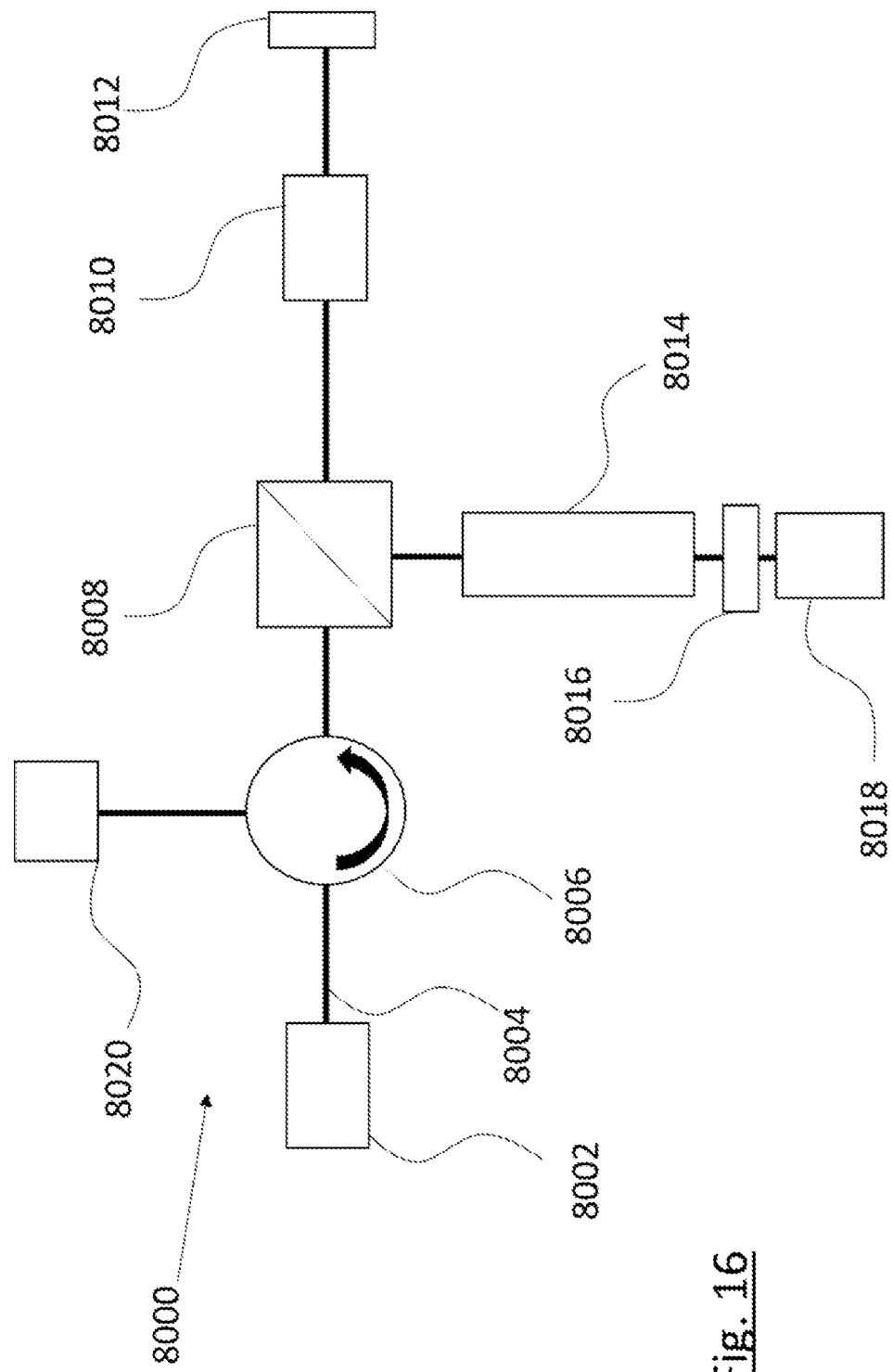
FIG. 16 shows another example of the apparatus.

FIG. 16 shows another example of the apparatus. In this example the apparatus 8000 is represented by a set of components photonically connected by free-space propagation wherein the line 8004 shows the optical paths between the components. This set-up may equally be implemented using optical fibre or integrated optics. In this example the apparatus uses polarisation to keep the photons in the cavity.

Throughout the description of this example reference is made to sources and detectors and a photonic memory wherein the reader is to understand that such components may be like those described with respect to FIG. 15a and other examples described elsewhere herein.

Photon source 8002 generates single photon states (i.e. the 'first photon' or train of first photons) and inputs them, via an optional optical circulator 8006 to a polarisation beam splitter 8008. In this example the polarisation beam splitter (PBS) is set to be transmissive to TE modes and reflective to TM modes, however the opposite configuration may be used. The PBS 8008 in this example is a bulk optic PBS however other PBS's may be used. The source 8002 outputs first photons aligned with the transmissive polarisation of the PBS (i.e. in TE mode). The source 8002 may also include a polarisation controller to allow for control and fine tuning of the output photon polarisation.

The PBS 8008 passes the first photon through to a polarisation rotator 8010. In this example the rotator is a Pockels cell, but other rotators may be used such as liquid crystal-based devices and other Faraday effect-based devices. The first photon passes through the polarisation rotator 800 and is incident upon a reflector 8012. The reflector 8012 in this example is a mirror, preferably a dichroic mirror set to reflect the first photon back toward the polarisation rotator 8010. Other reflectors may be used including a loop of optical fibre. The polarisation rotator receives the reflected first photon and transmits the first photon back towards the PBS 8008. During the first photons journey from the PSB 8008 towards the rotator 8010 and back into the PBS 8008 after being reflected by the dichroic mirror 8012, the polarisation rotation changes the polarisation of the first photon by approximately or exactly 90 degrees from its initial polarisation it had when exiting the circulator 8006 towards the PBS 8008. In this example the photon changes polarisation from TE to TM. Once in TM polarisation, the first photon gets reflected off the PBS towards the memory 8014 where it may be controllably stored and subsequently emitted (as described in previous examples) via a control pulse input into the memory by EM control pulse source 8018. If the first photon is passed through the memory or is stored then emitted, it travels towards a second reflector 8016. In this example the second reflector is a wavelength selective reflector set to reflect the wavelength of the first photon but transmit the wavelengths of the control pulses input via the second source 8018. In this example reflector 8108 is a dichroic mirror, however other components may be used.

The photonic cavity in this example is defined by end reflectors 8012 and 8016 and has the PBS 8008 as another reflector within the cavity.

The EM control pulses generated by the second photonic source 8018 are generated outside of the cavity and input into the dichroic mirror from the opposite side to where the first photons are incident upon the mirror 8016. The EM control pulses pass through the mirror 8016 and into the cavity, being incident upon the photonic memory 8014 for controllably storing or emitting at least a portion of a first photon synchronously incident into the memory.

The polarisation rotator 8010 is synchronised (with the receiving of the first photon by the rotator) to rotate the first photon or another of the first photons from the first source 8002 when the said photon enters the cavity via the PBS 8008. The first photon may have its polarisation rotated on the first pass through the rotator towards the mirror 8012 or on the second pass through the rotator once being reflected by the mirror 8012 (or via a combination of both passes). Once the first photon is in the TM mode, the rotator is preferably controlled to not rotate the first photons polarisation as it passes through the rotator again, until it is desired to be switched out of the cavity. Until this 'switching out' happens, the first photon propagates back and forth in the cavity between the mirrors 8012 and 8016, being reflected off PBS 8008. When switching out is required, the rotator 8010 is synchronised and controlled (in a similar manner to how it rotated the first photons polarisation to TM) to rotate the first photon back to TE. This control is achieved preferably using one or more electrical control signals from a control system or controller similar to that described elsewhere herein. Again, this can be achieved when the first photon is passing through the rotator towards the PBS 8008 or mirror 8012 or both. Now the first photon is back in TE, the PBS 8008 transmits the first photon through to the circulator 8006 and out of the cavity. The circulator 8006 directs the first photon towards a photon detector or photon detection system 8020. Again, as with other examples, the detector 8020 may output electrical signals that may be used to tune or otherwise determine electrical control signals for controlling any of the photonic sources 8002, 8018 and/or the rotator 8010.

Alternatives to this set up may be used include not using the circulator 8006 and replacing it with a WDM like that described for FIG. 15a. In this case, at some point there would need to be a wavelength conversion of the first photon, for example by using different EM control pulse wavelengths to store and emit the first photon (as described for FIG. 15a). Another alternative is to use another PBS in replacement of mirror 8012. Unlike the PBS 8008 which reflects photons at 90 degrees from transmitted photons, this further PBS would need to reflect photons at 180 degrees from transmitted photons.

The photonic memories used in the apparatus described elsewhere herein, may also be referred to as quantum memories. Quantum memories may be any memory that can receive and store one or more modes of EM radiation and output the stored mode/s of electromagnetic radiation upon receiving an EM control signal. These may be quantum memories that utilise an atomic transition to store and release an optical mode. Examples of such optical memories include those utilising an electronic transition of an atomic ensemble, for example between a ground and Rydberg state. As discussed elsewhere herein, some quantum memories may be any suitable memory using an atomic system. For example, the atomic system may use energy states of valence electrons. Additionally, or alternatively, the atomic system may use energy states such as those of a rare earth ion locked in a host medium such as a crystal. Other examples of atomic systems are presented elsewhere herein that may be used with the different apparatus.

The atomic ensemble may be held in a vapour cell. An example of such a quantum memory that can be used with the apparatus of the present application is described in International patent application WO2017212212, the entire contents of which are incorporated herein by reference. However, unlike the use of the quantum memory described in International patent application WO2017212212 where electromagnetic modes were output deterministically, the present application may use a memory element by applying a control signal to output the stored modes in a superposition of stored and emitted states, i.e. non-deterministically.

The following is an example of a quantum memory device for use with the apparatus, however other quantum memories may be used. Furthermore, the features and configurations described in this quantum memory example are not intended to be a single limited example, moreover any one or more the said features and configurations may be present in the apparatus or a method described herein. For example, the memory used with the apparatus may have any of the optional frequency ranges, wavelengths, source types, atomic transitions types, relationship between atomic transition and signal/control electromagnetic radiation.

The quantum memory may be a quantum memory device for storing one or more modes of electromagnetic radiation. The quantum memory device may comprise an atomic ensemble comprising atomic valence electrons having a first state, a second state and a third state. The second state has a higher energy than the first state. One or more atomic transition links the second state to the first state. The third state has a higher energy than the second state. One or more atomic transition links the third state to the second state.

FIG. 3 shows an example of such an atomic ensemble where the first state (or 'level') 108a is a 5S atomic orbital, the second state 108b is a 5P atomic orbital whilst the third state 108c is a 5D atomic orbital. An example of the energy level transition frequencies and wavelengths may be: 776 nm (386 THz) between the second and third energy levels (5P-5D) and 780 nm (384 THz) between the first and second energy levels (5S-5P). Other energy levels may be used depending upon the atomic orbitals used in the atomic system and the type of atomic system. The off-resonance level 108d may be offset from the second level 108b by any amount of frequency, either above or below the second level 108b, including but not limited to 15.2 GHz.

The atomic ensemble 106 may comprise rubidium atoms such that the first state is the 5S state of rubidium, the second state is the 5P state of rubidium and the third state is the 5D state of rubidium, however other atoms may be used aside from or as well as rubidium.

In operation the atomic ensemble 106 can store one or more modes 110 of electromagnetic radiation that are incident upon the atomic ensemble. The frequency of these modes corresponds to an off-resonant 108d atomic transition between the first state 108a and the second state 108b. Alternatively the off-resonant 108d atomic transition may be between the second state 108b and the third state 108c.

One or more of these incident modes may stimulate off-resonant transitions of the atomic valence electrons between the first state 108a and the second state 108b. This electromagnetic radiation may originate from a source referred to as the signal source and corresponds to the photon intended to be stored in the above examples of the apparatus. For purposes of discussion, these modes shall be referred to as the 'signal modes'. The electromagnetic radiation from the signal source that is incident upon the atomic ensemble may have a bandwidth of greater than 1 GHz.

Preferably, the signal modes have a frequency that is outside the collisional linewidth of the transition between the second and third states (or first and second states if the signal photon is associated with the off resonance transition between the second and third levels 108b, 108c). Additionally, or alternatively, the electromagnetic radiation frequency of the signal mode may be off-resonant from the frequency of the transition between the first state and the second state of the atomic valence electrons in the atomic ensemble by between 5 GHz and 100 GHz. An example of this transition frequency is approximately 50 GHz. Additionally, or alternatively, the frequency of the electromagnetic radiation generated by the signal source may be off-resonant from the frequency of the transition between the first state and the second state by approximately ten times the bandwidth of the electromagnetic radiation generated by the signal source. Additionally, or alternatively, the bandwidth of the electromagnetic radiation generated by the signal source is between 1 GHz and 1.7 THz, e.g. between 1 GHz and 1 THz, e.g. between 10 GHz and 500 GHz, e.g. approximately 100 GHz.

To store the one or more signal modes, further electromagnetic radiation is incident upon the atomic ensemble. As described above, this radiation may be referred to as the 'storing photons' and corresponds to the second EM radiation described in with respect to FIGS. 4a-4d. The general term 'control' photons or 'control' source or 'control' EM radiation relates to either the EM radiation used to read the signal photons into the memory or the EM radiation used to read out the signal photon from the memory. As discussed elsewhere herein, this may be EM radiation of the same frequency or a different frequency from the same EM source or different EM sources.

The control 'storing' photons may have a frequency corresponding to an off-resonant atomic transition from the one or more atomic transitions linking the second state and the third state of atomic valence electrons in the atomic ensemble (or the first and second states in examples where the signal photon corresponds to an off resonant transition between the second and third states).

The electromagnetic control signal may be generated by one or more one or more control sources such as but not limited to second harmonic generated pulses or any of the example sources described in examples herein. The electromagnetic radiation from the control sources incident upon the atomic ensemble may have a bandwidth of greater than 1 GHz. Preferably, the electromagnetic control signal has a summed frequency that is outside the collisional linewidth of the transition between the first and second states (or the second and third states in examples where the signal photon corresponds to an off resonant transition between the second and third states).

Additionally, or alternatively, the frequency or sum of the frequencies of the electromagnetic control signal may be off-resonant from the frequency of the transition between the second state and the third state of the atomic valence electrons in the atomic ensemble by between 5 GHz and 100 GHz. This may be approximately 50 GHz. Additionally, or alternatively, the sum of the frequencies of the electromagnetic radiation generated by the one or more control sources may be off-resonant from the frequency of the transition between the first state and the second state by approximately ten times the bandwidth of the electromagnetic radiation generated by the one or more control sources.

The bandwidth of the electromagnetic radiation generated by each of the one or more control sources may be between 1 GHz and 1.7 THz; for example, between 1 GHz and 1 THz, or between 10 GHz and 500 GHz, for example approximately 100 GHz. Additionally, or alternatively, the sum of the frequencies of the electromagnetic radiation generated by the signal source and the one or more control sources is substantially equal to the sum of the frequency of the transition between the first and second states and the frequency of the transition between the second and third states of the atomic valence electrons in the atomic ensemble.

When both the one or more modes of electromagnetic radiation from the signal source and the electromagnetic control signal electromagnetic are incident upon the atomic ensemble, the quantum memory device may store one or more signal modes via a coherent excitation of the transition between the first state and the third states. The number of signal photons stored depends upon the photon flux of the control EM radiation. Furthermore, the control EM radiation may be set to have an incident photon flux into the memory that allows a signal photon to be put into a quantum superposition of being stored or not stored.

After being stored, the quantum memory device may release or 'read-out' the stored signal mode by stimulating the emission of the stored signal mode when a further subsequent electromagnetic control signal is incidence upon the atomic ensemble. This further electromagnetic radiation is one or more control photons as described above, also referred to in above examples of the apparatus as third EM radiation with respect to FIGS. 4a-4d. The third EM radiation is arranged to be incident upon the atomic system within the lifetime of the coherent excitation used to store the signal photon. This may be achieved in any suitable way including having the clock rates of the signal and control pulse sources having a time period that is less than the lifetime of the coherent excitation between the first and third states used to store the signal photon. Examples of EM source clock rates include any of greater than 50 MHz, greater than 200 MHz, greater than 1 GHz, approximately 80 MHz.

FIG. 14b shows an example of a memory 6018 having an atomic ensemble 6028 accommodated within a waveguide. This waveguide may be any waveguide including an integrated optic waveguide or an optical fibre 6019. For the example shown in FIG. 14b, this is a single-mode optical fibre 6019. The atomic ensemble 6028 may be integrated with the waveguide. In FIG. 14b the quantum memory comprises a vapour cell 6034 that holds the atomic ensemble 6028. This vapour cell 6028 is integrated into the optical fibre 6019. The optical fibre 6019 comprises a hollow core 6026 within which the vapour cell 6034 hosting the atomic ensemble 6034, is held. The optical fibre 6019 may comprise or be a hollow core photonic crystal fibre.

The optical fibre 6019 is optically coupled to one or more waveguides that deliver the signal 6030 and control 6032 EM radiation to the vapor cell 6034. This coupling may also be a physical coupling between the waveguide 6019 holding the vapour cell and the waveguides 6016 used to deliver the EM radiation. In FIG. 14b, these waveguides are further single mode optical fibres 6016 spliced or otherwise physically coupled to the optical fibre 6019 accommodating the vapour cell 6034. A first waveguide 6016 is electromagnetically coupled to the signal source of electromagnetic radiation and is connected to a first end of the memory optical fibre 6019. The signal mode 6030 is incident upon the atomic ensemble via the first waveguide. A second waveguide 6016 is electromagnetically coupled to the one or more control sources of electromagnetic radiation and is connected to a second end of the memory optical fibre 6019, that is distal to the first end. The control signal 6032 is incident upon the atomic ensemble via the second waveguide. When the memory of FIG. 14b is used with the loop architecture of FIG. 14a, the first and second waveguides used to introduce the control and signal EM radiation into the memory fibre 6019 are the fibres 6016 forming part of the loop. This example of memory element may be adapted according to any suitable features described herein including but not limited to any of the following: the type of waveguide hosting the atomic ensemble, the requirement for a cell with its own wall or whether the hosting waveguide forms at least one of the cell wall/s, the type of atomic system in the vapour cell (e.g. type and/or number of atoms/ions and their state of matter), the number of waveguides used to couple EM radiation into/out of the memory 6018 (for example the memory may have a mirrored end facet and only one input waveguide), the environment the memory is held in, for example room temperature or cryogenic, the size and shape of the vapour cell and its located within the waveguide.

The electromagnetic radiation 6030 from the signal source and the electromagnetic radiation 6032 from the one or more control sources are arranged to be incident upon the atomic ensemble 6034 in substantially opposite directions, however other relative directions may be used. Preferably, the frequency of the electromagnetic radiation generated by the signal source differs by less than ten percent from the sum of the frequencies of the electromagnetic radiation generated by the one or more control sources. Preferably the difference between the frequency of the electromagnetic radiation from the signal source and the sum of the frequencies of the electromagnetic radiation from the one or more control sources may be greater than the frequency by which the electromagnetic radiation from the signal source. Additionally, or alternatively, the sum of the frequencies of the electromagnetic radiation from the one or more control sources may be off-resonance from the respective transitions they are stimulating.

Propagating the different electromagnetic radiation in opposite directions allows for the inverse of the residual Doppler linewidth owing to the incidence of the electromagnetic radiation generated by the signal source and the one or more control sources on the atomic valence electrons in the atomic ensemble to be greater than half the lifetime of the coherent excitation of the transition between the first state and the third state. For transitions involving more than three energy levels, Doppler cancellation may be achieved by varying the angles between the different electromagnetic radiations involved in the transition. In the case of solid-state or cold atom systems, the electromagnetic radiations can also be co-propagating.

The wavelength of operation of any of the apparatus or methods described herein may be any photonic wavelength, including but not limited to any of: optical wavelength, infra-red wavelengths, visible wavelengths; telecoms ITU grid wavelength such as the O-band (original band: 1260-1360 nm); the C-band (conventional band: 1530-1565 nm), the L-band (long-wavelength band: 1565-1625 nm); the S-band (short-wavelength band: 1460-1530 nm); the E-band (extended-wavelength band: 1360-1460 nm). Any of the apparatus may be a kit of parts or a device or a set of devices with one or more components in each device.

The invention claimed is:

1. An apparatus for storing one or more photons, the apparatus comprising:
    I) a plurality of photonic elements for reflecting electromagnetic radiation; at least two of the plurality of photonic elements forming a photonic cavity; the plurality of photonic elements comprising:
        at least one photonic element for receiving first electromagnetic radiation from outside the photonic cavity and transmitting the received first electromagnetic radiation into the photonic cavity;
        at least one photonic element for receiving second electromagnetic radiation from outside the photonic cavity and transmitting the received second electromagnetic radiation into the photonic cavity;
    II) a photonic memory disposed in the photonic cavity, the photonic memory comprising an atomic system configured to:
        receive at least one photon of the first electromagnetic radiation, the photon having a field;
        receive the second electromagnetic radiation and receive third electromagnetic radiation;

store at least a portion of the field of the photon in the atomic system via an atomic transition using the photon and the received second electromagnetic radiation;

emit the stored portion of the field of the photon upon receiving the third electromagnetic radiation;

the apparatus further configured to:

direct the photon into the photonic memory, after being reflected back into the photonic cavity by at least one of the plurality of photonic elements;

output the emitted portion of the field into the photonic cavity;

control a photon flux density of the third electromagnetic radiation to control a superposition of the said stored field portion of the photon in states of:

a) continued storage by the atomic system;
b) emitted by the atomic system.

2. The apparatus as claimed in claim 1, wherein the atomic system comprises discrete energy states; the discrete energy states having a first energy state, a second energy state and a third energy state; the third energy state having a higher energy than the second energy state; the second energy state having a higher energy than the first energy state; the photonic memory configured to:

I) receive the first electromagnetic radiation comprising the at least one photon; the photon having a field and a first frequency; the first frequency associated with a first energy;

II) receive the second electromagnetic radiation, the second electromagnetic radiation having a second frequency; the second frequency corresponds to a second energy:

a) such that the sum of the first energy and the second energy corresponds to a resonance between the third and first energy states of the atomic system;
b) that is different to the energy difference between the first and second energy states of the atomic system;
c) that is different to the energy difference between the second and third energy states of the atomic system;

III) use the second electromagnetic radiation to cause the photon to have at least a portion of its field stored in the atomic system by a portion of the atomic system's electrons transitioning between the first and third energy states;

IV) receive the third electromagnetic radiation; the third electromagnetic radiation having a third frequency; the third frequency corresponding to a third energy:

d) that is less than the energy difference between the first energy state and the third energy state;
e) that is different to the energy difference between the first and second energy states of the atomic system;
f) that is different to the energy difference between the second and third energy states of the atomic system;

V) use the third electromagnetic radiation to cause at least a part of the stored field portion to be emitted from the atomic system.

3. The apparatus as claimed in claim 1, wherein the apparatus is configured to change, within the photonic cavity, the photon from a first state to a second state; the first state and the second state of the photon being different in at least one of:

A) polarisation; or
B) wavelength;

wherein at least one of the plurality of photonic elements is configured to transmit the photon in the first state and reflect the photon in the second state.

4. The apparatus as claimed in claim 3, further comprising:

a first photonic element for receiving the first electromagnetic radiation from outside the photonic cavity and transmitting the received first electromagnetic radiation into the photonic cavity;

a second photonic element for receiving the second electromagnetic radiation from outside the photonic cavity and transmitting the received second electromagnetic radiation into the photonic cavity.

5. The apparatus as claimed in claim 4, the apparatus comprising:

a third photonic element separate to the first and second photonic elements, wherein the photonic cavity extends between the second and third photonic elements;

a polarisation rotator in the photonic cavity wherein, the first photonic element comprises a polarisation splitter; the first and second state of the photon being different at least in polarisation.

6. The apparatus as claimed in claim 5, wherein:

the second and third photonic elements reflect the photon in both the first and second states;

the first photonic element transmits the photon in the first state and reflects the photon in the second state.

7. The apparatus as claimed in claim 5, further comprising a photonic circulator outside of the photonic cavity and configured to:

receive the first electromagnetic radiation and transmit the first electromagnetic radiation to the first photonic element;

receive the photon from the first photonic element and output the photon to a detection apparatus.

8. The apparatus as claimed in claim 5, wherein the polarisation rotator is configured to:

receive the photon from the polarisation splitter apparatus in the first state;

transmit the photon to the third photonic element;

receive the photon from the third photonic element;

output the photon towards the polarisation splitter in the second state.

9. The apparatus as claimed in claim 4, wherein the atomic system is configured to:

store the photon in the first state comprising a first wavelength;

emit the photon field in the second state, the second state comprising a different wavelength to the first wavelength;

the first photonic element and the second photonic element are wavelength selective reflectors configured to reflect the wavelength of the second state and transmit the wavelength of the first state.

10. The apparatus as claimed in claim 9, wherein the first and second photonic elements are configured to transmit the second and third electromagnetic radiation.

11. The apparatus as claimed in claim 10, wherein:

the first photonic element comprises a first fibre Bragg grating; and the second photonic element comprises a second fibre Bragg grating.

12. The apparatus as claimed in claim 1, wherein the atomic system comprises an atomic ensemble comprising rubidium atoms.

13. The apparatus as claimed in claim 1, further comprising a control system for controlling a photon flux density of the second electromagnetic radiation and the photon flux density of the third electromagnetic radiation.

14. The apparatus as claimed in claim 13, wherein the control system is further configured to control temporal pulse widths of the second and third electromagnetic radiation.

15. The apparatus as claimed in claim 1, wherein the apparatus controls a photon flux density of any of:
   the second electromagnetic radiation
   the third electromagnetic radiation;
based on a feedback signal from an optical detector detecting a further photon previously output by the photonic system.

16. The apparatus as claimed in claim 2, wherein the photonic element for receiving the second electromagnetic radiation from outside the photonic cavity further receives the third electromagnetic radiation from outside the photonic cavity and directs the received third electromagnetic radiation into the photonic cavity.

17. The apparatus as claimed in claim 16, wherein the photonic element for receiving the first electromagnetic radiation from outside the photonic cavity and the photonic element for receiving the second electromagnetic radiation from outside the photonic cavity are the same photonic element.

18. The apparatus as claimed in claim 17, wherein the said same photonic element comprises an interferometer comprising a controllable phase modulator in at least one arm.

19. The apparatus as claimed in claim 15, wherein the photonic cavity is a photonic loop cavity.

20. A method of storing one or more photons in a photonic memory and emitting one or more photons from the photonic memory, the photonic memory comprising an atomic system, the photonic memory disposed in a photonic cavity; the photonic cavity formed by at least two of a plurality of photonic elements for reflecting electromagnetic radiation; the method comprising:
   receiving first electromagnetic radiation, by at least one of the said photonic elements, from outside the photonic cavity and transmitting the received first electromagnetic radiation into the photonic cavity;
   receiving second electromagnetic radiation, by at least one of the said photonic elements, from outside the photonic cavity and transmitting the received second electromagnetic radiation into the photonic cavity;
and in any order:
   A) receiving, with the atomic system, at least one photon of the first electromagnetic radiation, the photon having a field;
      receiving, with the atomic system, the second electromagnetic radiation;
      storing at least a portion of the field of the photon in the atomic system via an atomic transition using the photon and the received second electromagnetic radiation;
      emitting the stored portion of the photon upon the atomic system receiving third electromagnetic radiation;
   B) directing the photon into the photonic memory, after being reflected into the photonic cavity by at least one of the plurality of photonic elements; and then:
      outputting the emitted portion of the field into the photonic cavity;
   C) controlling a photon flux density of the third electromagnetic radiation to control a superposition of the stored field portion of the photon in states of:
      a) continued storage by the atomic system;
      b) emitted by the atomic system.

\* \* \* \* \*